(12) United States Patent
Youngner

(10) Patent No.: US 10,950,408 B2
(45) Date of Patent: *Mar. 16, 2021

(54) APPARATUSES, SYSTEMS, AND METHODS FOR ION TRAPS

(71) Applicant: Honeywell International Inc., Morris Plains, NJ (US)

(72) Inventor: Daniel Youngner, Maple Grove, MN (US)

(73) Assignee: Honeywell International Inc., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/774,886

(22) Filed: Jan. 28, 2020

(65) Prior Publication Data

US 2020/0227226 A1 Jul. 16, 2020

Related U.S. Application Data

(60) Continuation of application No. 16/399,568, filed on Apr. 30, 2019, now Pat. No. 10,546,734, which is a
(Continued)

(51) Int. Cl.
*H01J 3/38* (2006.01)
*H01J 9/14* (2006.01)
(Continued)

(52) U.S. Cl.
CPC ............... *H01J 3/38* (2013.01); *B82Y 10/00* (2013.01); *G06N 10/00* (2019.01); *G21K 1/00* (2013.01);
(Continued)

(58) Field of Classification Search
CPC ........ H01J 3/00; H01J 3/04; H01J 3/10; H01J 3/14; H01J 3/18; H01J 3/22; H01J 3/26;
(Continued)

(56) References Cited

U.S. PATENT DOCUMENTS 7,180,078 B2   2/2007  Pau et al.
9,558,908 B2 * 1/2017  Youngner ................ G21K 1/00
(Continued)

FOREIGN PATENT DOCUMENTS

EP   2154586 A2   2/2010
EP   3050843 A1   8/2016

OTHER PUBLICATIONS

Niedermayr, et al., "Cryogenic surface ion trap based on intrinsic silicon", New Journal of Physics, vol. 16, Nov. 26, 2014, 11 pp.
(Continued)

*Primary Examiner* — Jason L McCormack
(74) *Attorney, Agent, or Firm* — Brooks, Cameron & Huebsch, PLLC

(57) ABSTRACT

Apparatuses, systems, and methods for ion traps are described herein. One apparatus includes a number of microwave (MW) rails and a number of radio frequency (RF) rails formed with substantially parallel longitudinal axes and with substantially coplanar upper surfaces. The apparatus includes two sequences of direct current (DC) electrodes with each sequence formed to extend substantially parallel to the substantially parallel longitudinal axes of the MW rails and the RF rails. The apparatus further includes a number of through-silicon vias (TSVs) formed through a substrate of the ion trap and a trench capacitor formed in the substrate around at least one TSV.

20 Claims, 11 Drawing Sheets

Related U.S. Application Data continuation of application No. 15/919,959, filed on Mar. 13, 2018, now Pat. No. 10,304,650, which is a division of application No. 15/334,067, filed on Oct. 25, 2016, now Pat. No. 9,916,957, which is a division of application No. 14/700,312, filed on Apr. 30, 2015, now Pat. No. 9,558,908.

(51) Int. Cl.
| | | |
|---|---|---|
| *G06N 10/00* | (2019.01) | |
| *B82Y 10/00* | (2011.01) | |
| *G21K 1/00* | (2006.01) | |
| *H01J 49/00* | (2006.01) | |
| *H01L 29/94* | (2006.01) | |

(52) U.S. Cl.
CPC ............... *H01J 9/14* (2013.01); *H01J 49/00* (2013.01); *H01J 49/0018* (2013.01); *H01L 29/945* (2013.01)

(58) Field of Classification Search
CPC ...... H01J 3/38; H01J 3/40; H01J 49/00; H01J 49/0027; H01J 49/02; H01J 49/022; H01J 49/06; H01J 49/061; H01J 49/062; H01J 49/063; H01J 49/065; H01J 49/066; H01J 49/067; H01J 49/068
USPC ........ 250/489, 281, 282, 283, 284, 286, 290
See application file for complete search history.

(56) References Cited

U.S. PATENT DOCUMENTS

| | | | |
|---|---|---|---|
| 10,304,650 B2 * | 5/2019 | Youngner | .............. B82Y 10/00 |
| 10,546,734 B1 * | 1/2020 | Youngner | ................. H01J 3/38 |
| 2006/0219888 A1 | 10/2006 | Jachowski et al. | |
| 2012/0181661 A1 | 7/2012 | Booth et al. | |

OTHER PUBLICATIONS

Extended Search Report from related European Patent Application No. 16156215, dated Sep. 28, 2016, 10 pp.
Allcock, Surface-Electrode Ion Traps for Scalable Quantum Computing, 2011, Hertford College Oxford, pp. 1-208.
Guise et al., Ball-Grid Architecture for Microfabricated Ion Traps, May 6, 2015, Georgia Tech Research Institute, pp. 1-11.
Youngner et al., SMIT Ball Grid Array Final Report, Oct. 1, 2014, Georgia Tech Research Institute, pp. 1-1 through 5-66.

* cited by examiner

APPARATUSES, SYSTEMS, AND METHODS FOR ION TRAPS

PRIORITY INFORMATION

This application is a continuation of U.S. patent application Ser. No. 16/399,568, filed Apr. 30, 2019, which is a continuation of U.S. patent application Ser. No. 15/919,959, filed Mar. 13, 2018, now U.S. Pat. No. 10,304,650, which is a divisional of U.S. patent application Ser. No. 15/334,067, filed Oct. 25, 2016, now U.S. Pat. No. 9,916,957, which is a divisional of U.S. patent application Ser. No. 14/700,312, now U.S. Pat. No. 9,558,908, filed Apr. 30, 2015, the entire contents of which are hereby incorporated by reference.

STATEMENT OF GOVERNMENT RIGHTS

This invention was made with Government support under contract: W911NF-12-1-0605, awarded by the U.S. Army. The Government has certain rights in this invention.

TECHNICAL FIELD

The present disclosure relates to apparatuses, systems, and methods for ion traps.

BACKGROUND

An ion trap can use a combination of electrical and magnetic fields to capture one or more ions in a potential well. Ions can be trapped for a number of purposes, which may include mass spectrometry, research, and/or controlling quantum states, for example.

Previous approaches to ion trapping may include an ion trap surrounded by a number of on-chip filter capacitors, among other on-chip components, which may occupy on-chip space and/or affect visualization or imaging of trapped ion(s).

DETAILED DESCRIPTION

Figure 1A:
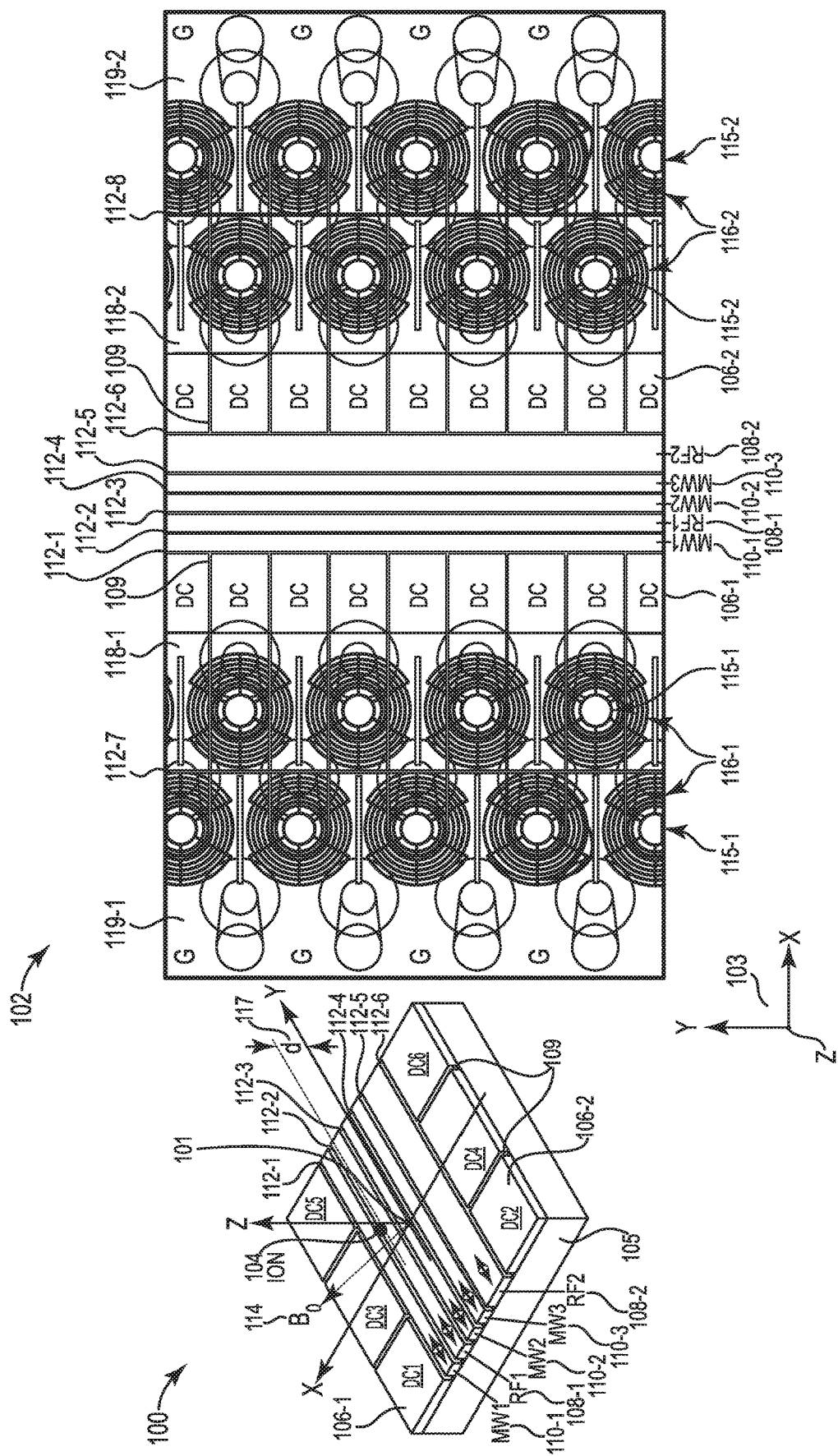
FIG. 1A illustrates a perspective view and a top view of portions of an ion trap in accordance with one or more embodiments of the present disclosure.

A microwave (MW) source associated with an ion trap may contribute to an increased efficiency, relative to other approaches, in trapping and/or causing transition between quantum states of at least one ion in a potential well. However, providing MW fields with sufficient strength near such ions may be a challenge, for instance, when space-limiting on-chip filter capacitors, among other on-chip components, are present.

The present disclosure describes, in various embodiments, that a number of MW rails can be near an upper surface of an ion trap, which also can include a number of radio frequency (RF) rails, the upper surface of the ion trap having a planarized topology. Accordingly, one example of an ion trap apparatus includes a number of MW rails and a number of RF rails formed with substantially parallel longitudinal axes and with substantially coplanar upper surfaces. The apparatus includes two sequences of direct current (DC) electrodes with each sequence formed to extend substantially parallel to the substantially parallel longitudinal axes of the MW rails and the RF rails. The apparatus further includes a number of through-silicon vias (TSVs) formed through a substrate of the ion trap and a trench capacitor formed in the substrate around at least one TSV.

In the following detailed description, reference is made to the accompanying figures that form a part hereof. The figures show by way of illustration how one or more embodiments of the disclosure may be practiced.

The figures herein follow a numbering convention in which the first digit or digits correspond to the drawing figure number and the remaining digits identify an element or component in the drawing. Similar elements or components between different figures may be identified by the use of similar digits. For example, 109 may reference element "09" in FIG. 1, and a similar element may be referenced as 209 in FIG. 2.

FIG. 1A illustrates a perspective view and a top view of portions of an ion trap in accordance with one or more embodiments of the present disclosure. The perspective view of the ion trap 100 embodiment illustrated in FIG. 1A shows a three-dimensional direction indicator 101 where the x axis corresponds to a horizontal direction of the ion trap, the y axis corresponds to a longitudinal direction of the ion trap, and the z axis corresponds to a vertical direction relative to an upper surface of the ion trap, the upper surface positioned on a face of the ion trap opposite from an interposer die, as described further herein.

As illustrated in FIG. 1A, the ion trap 100 can be fabricated on a substrate 105. For example, the substrate 105 can be formed on and/or from a silicon wafer, which can, in various embodiments, have a thickness in a range of from around 50 micrometers (microns) to around 500 microns.

In various embodiments, a number of RF rails (e.g., RF1 108-1 and RF2 108-2) and a number of MW rails (e.g., MW1 110-1, MW2 110-2, and MW3 110-3) can be fabricated above an upper surface of the substrate 105. As described further herein, other materials (e.g., dielectrics, insulators, shields, etc.) can be formed between the substrate 105 and components (e.g., RF rails, MW rails, etc.) fabricated above the upper surface thereof. As shown in FIG. 1A, each of the RF rails and the MW rails can be formed with substantially parallel longitudinal axes (in the y direction) and with substantially coplanar upper surfaces (relative to a line in the x direction). In some embodiments, each of the DC electrodes can be formed with substantially coplanar upper surfaces that are substantially coplanar with the upper surfaces of the MW rails and the RF rails.

Two RF rails and three MW rails are illustrated in FIG. 1A and other figures of the present disclosure, although embodiments are not limited to these numbers and configurations of RF rails and MW rails. That is, the RF rails and MW rails can be fabricated in various configurations such that the number, the heights (in the z direction), and/or the widths (in the x direction) of such rails can be varied as suitable for particular applications. Moreover, the order in which the RF rails and/or MW rails are fabricated also can be varied. That is, a position in a sequence of such rails can be varied such that a pair of MW rails may be adjacent each other and/or a pair of MW rails may be separated by at least one RF rail and similarly with regard to the RF rails relative to the MW rails. In various embodiments, three or more MW rails may be asymmetrically positioned, as illustrated in FIG. 1A and other figures of the present disclosure, such that there are, for example, two adjacent MW rails and one MW rail separated from the two adjacent MW rails by an RF rail.

The RF rails and/or MW rails described as being adjacent each can be separated (e.g., insulated) by a longitudinal gap (e.g., longitudinal gaps 112-2, 112-3, 112-4, 112-5), as described further herein, fabricated to form substantially parallel longitudinal axes (in the y direction) of the RF rails 108-1,108-2 and the MW rails 110-1, 110-2, 110-3. In some examples, the gaps can be at least partially filled with an insulating material (e.g., a dielectric material). In some embodiments, the dielectric material can be silicon dioxide (e.g., formed by thermal oxidation), for instance, although embodiments of the present disclosure are not so limited.

The RF rails and/or MW rails can, in various embodiments, be fabricated from a conductive material (e.g., copper, silver, gold, etc.) or alloys of two or more conductive materials selected as suitable for conduction and/or transmission of an appropriate signal. For example, a MW rail can be fabricated from copper with a cross-sectional height and/or width in a range of from around 10 microns to around 100 microns (e.g., in a circular, oval, square, rectangular, etc., cross-sectional configuration) determined appropriate to conduct a current (e.g., from around 0.1 amps (A) to around 1.0 A) oscillating at a MW frequency (e.g., from around 0.3 gigahertz (GHz) to around 300 GHz). In various embodiments, a RF rail can be fabricated, for example, from copper with a cross-sectional height and/or width in a range of from around 10 microns to around 100 microns determined appropriate to conduct a current (e.g., from around 0.01 A to around 1.0 A) oscillating at an RF frequency (e.g., from around 3 hertz (Hz) to around 0.3 GHz).

As shown in FIG. 1A, the RF rails 108-1,108-2 and the MW rails 110-1, 110-2, 110-3 can, in various embodiments, be fabricated between a first sequence of DC electrodes 106-1 and a second sequence of DC electrodes 106-2. Each of the sequences of DC electrodes can be fabricated to extend substantially parallel (in the y direction) to the substantially parallel longitudinal axes of the MW rails and the RF rails. In addition, each of the DC electrodes can be formed with an upper surface that is substantially coplanar with upper surfaces of the other DC electrodes and that is substantially coplanar with the upper surfaces of the MW rails and/or the RF rails. That is, in various embodiments, the DC electrodes, the MW rails, and/or the RF rails can be formed with substantially the same height.

Each of the DC electrodes in the first sequence of DC electrodes 106-1 and the second sequence of DC electrodes 106-2 can be separated (e.g., insulated) from adjacent RF rails 108-1,108-2 and/or adjacent MW rails 110-1, 110-2, 110-3 by a longitudinal gap (e.g., longitudinal gaps 112-1 and 112-6 in the y direction), as described further herein. Similarly, each of the DC electrodes in the first sequence of DC electrodes 106-1 and the second sequence of DC electrodes 106-2 can be separated (e.g., insulated) from each other by each being fabricated with a horizontal gap between adjacent DC electrodes (e.g., horizontal gaps 109 in the x direction). In some examples, the longitudinal gaps for the DC electrodes can be at least partially filled with an insulating material (e.g., a dielectric material). In some embodiments, a width (in the x direction) between the longitudinal gaps 112-1 and 112-6 can be from around 100 microns to around 500 microns.

The two sequences of DC electrodes 106-1, 106-2 can be fabricated as a plurality of matched DC electrodes. For example, as shown in ion trap 100, electrode DC1 of the first sequence of DC electrodes 106-1 can be matched with electrode DC2 of the second sequence of DC electrodes 106-2, electrode DC3 and be matched with electrode DC4, electrode DC5 and be matched with electrode DC6, and so on for the two sequences of DC electrodes 106-1, 106-2. Accordingly, the two sequences of DC electrodes 106-1, 106-2 in combination can be configured to be biased with DC voltages that contribute to a variable combined electrical field (not shown) and/or magnetic field (Bo) 114 to trap at least one ion 104 in a potential well above at least one of either an upper surface of the sequences of DC electrodes 106-1, 106-2, the RF rails 108-1,108-2, the MW rails 110-1, 110-2, 110-3, and/or a number of ground (GND) rails (e.g., RND rail 107 shown in FIG. 1B).

The at least one ion 104 can be trapped in variable locations in the ion trap 100 by the electrical and/or magnetic fields being controlled by one or more connected devices (e.g., a controller and/or computing device) with one or more bonds to an interposer (e.g., as discussed in connection with FIG. 3). For example, depending on the positive or negative charge on the at least one ion 104, DC voltages can be raised or lowered for DC electrodes on either side of a particular DC electrode to promote transit of the least one ion 104 to the particular electrode DC electrode and/or to form an electrical potential well that resists further transit of the least one ion.

Depending upon such factors as the charge on the at least one ion 104 and/or the shape and/or magnitude of the combined electrical and/or magnetic fields, the at least one ion can be stabilized at a particular distance (d) 117 (e.g., from around 20 microns to around 50 microns) above an upper surface of the ion trap 100 (e.g., the coplanar upper surfaces of the sequences of DC electrodes 106-1, 106-2, RF rails 108-1,108-2, MW rails 110-1, 110-2, 110-3, and/or GND rails 107). To further contribute to controlling transit between the variable locations and/or stabilizing the at least one ion 104 trapped in a particular location, the ion trap 100 can, in some embodiments, be operated within a cryogenic vacuum chamber (not shown) capable of cooling the ion trap 100 to, for example, a temperature of around 4 degrees Kelvin or lower.

A top view of an ion trap 102 embodiment illustrated in FIG. 1A shows a three-dimensional direction indicator 103 where the x axis corresponds to the horizontal direction of the ion trap 100 in the perspective view, the y axis corresponds to the longitudinal direction of the ion trap 100 in the perspective view, and the z axis corresponds to the vertical direction relative to the upper surface of the ion trap 100 in the perspective view. The top view of the ion trap 102 illustrates the same configuration of the number and/or positioning of the RF rails 108-1,108-2, the MW rails 110-1, 110-2, 110-3, and the sequences of DC electrodes 106-1, 106-2, along with the longitudinal 112 and the horizontal 109 gaps between them, as illustrated in the perspective view of the ion trap 100, although embodiments are not so limited.

The top view of the ion trap 102 illustrates that a number of TSVs 115-1, 115-2 can, in various embodiments, be fabricated (e.g., using a technique such as deep reactive-ion etching (DRIE), among others) through the substrate 105 of the ion trap 102. As described further herein, the number of the TSVs shown in FIG. 1A can be fabricated with upper surfaces at or below the substantially coplanar upper surfaces of the MW rails, the RF rails, and/or the DC electrodes. The number of TSVs 115-1, 115-2 shown in FIG. 1A can each be fabricated through the substrate in a position suitable for, and can be configured in a manner so as to, provide an electrical potential to each DC electrode in the two sequences of DC electrodes 106-1, 106-2.

The top view of the ion trap 102 also illustrates that a trench capacitor 116-1, 116-2 can be fabricated in the substrate 105 around the number of TSVs illustrated in FIG. 1A. As described further herein, a number of the trench capacitors 116-1, 116-2 shown in FIG. 1A can be fabricated with upper surfaces at or below the substantially coplanar upper surfaces of the MW rails, the RF rails, and/or the DC electrodes.

Figure 1B:
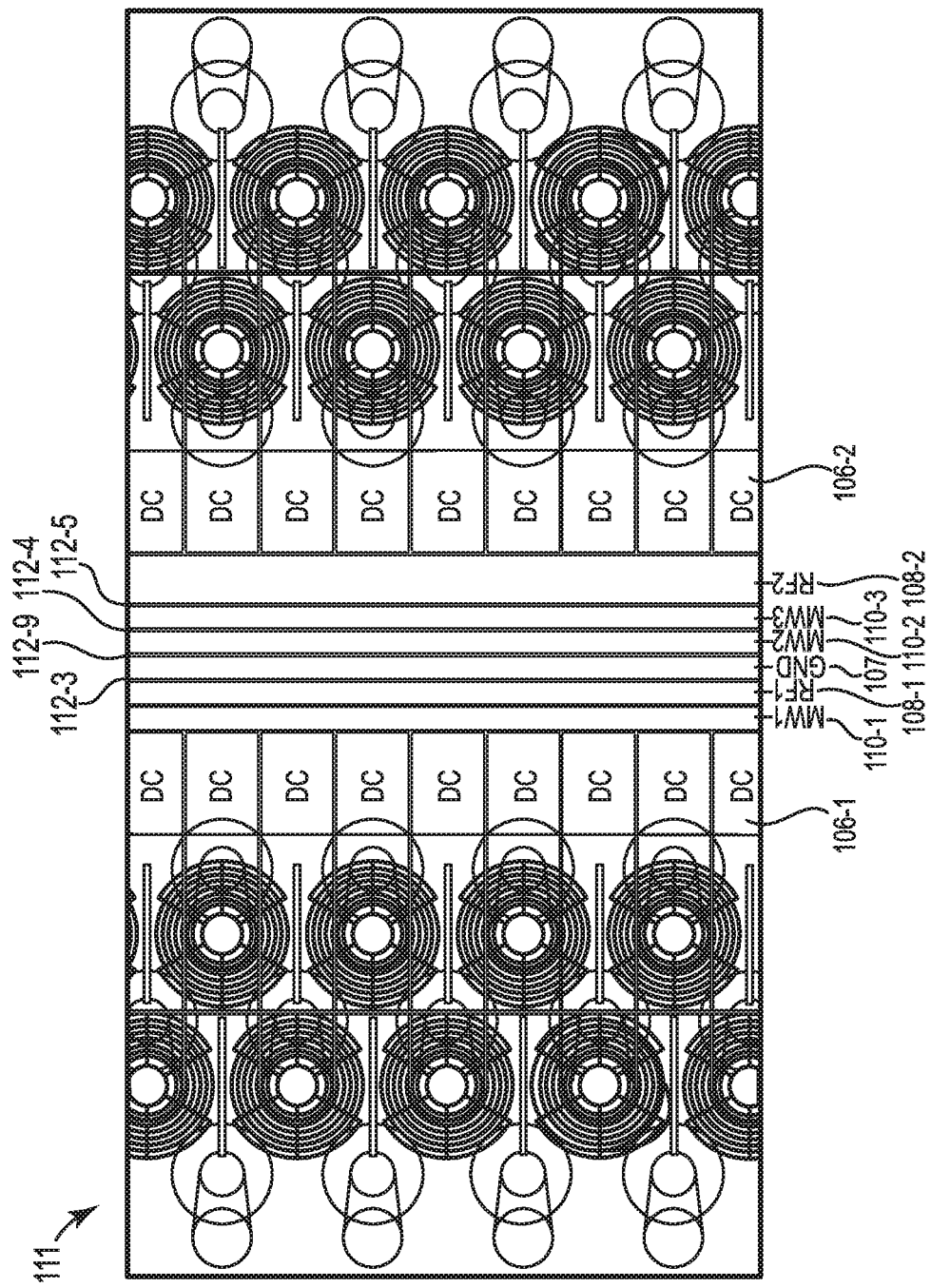
FIG. 1B illustrates another top view of a portion of an ion trap in accordance with one or more embodiments of the present disclosure.

FIG. 1B illustrates another top view of a portion of an ion trap in accordance with one or more embodiments of the present disclosure. A top view of an ion trap 111 embodiment illustrated in FIG. 1B shows that a number of GND rails (e.g., GND rail 107) can be fabricated between the two sequences of DC electrodes 106-1, 106-2 substantially parallel (in the y direction) to the substantially parallel longitudinal axes of the two sequences of DC electrodes 106-1, 106-2, the RF rails 108-1,108-2, and/or the MW rails 110-1, 110-2, 110-3. For example, FIG. 1B shows a single GND rail 107 fabricated between the MW2 rail 110-2 and the MW3 rail 110-3, where the MW2 rail 110-2 is adjacent the RF1 rail 108-1 and the MW3 rail 110-3 is adjacent the RF2 rail 108-2, although embodiments are not limited to this configuration.

The GND rails can, in various embodiments, be fabricated from a conductive material (e.g., copper, silver, gold, etc.) or alloys of two or more conductive materials selected as suitable for operation as a ground line. For example, a GND rail can be fabricated from copper with a cross-sectional height and/or width in a range of from around 10 microns to around 100 microns (e.g., in a circular, oval, square, rectangular, etc., cross-sectional configuration). The GND rails can each be formed with an upper surface substantially coplanar with upper surfaces of the MW rails, the RF rails, and/or the DC electrodes. As such, the GND rails can have widths that are the same as or different from widths of the MW rails and/or the RF rails, depending upon the particular application, although the DC electrodes, the MW rails, the RF rails, and/or the GND rails can be formed with substantially the same height, in various embodiments.

A GND rail that is adjacent an RF rail and/or a MW rail can be separated (e.g., insulated) therefrom by a number of longitudinal gaps. For example, GND rail 107 in FIG. 1B is separated from RF1 rail 108-1 by longitudinal gap 112-3 and GND rail 107 is separated from MW2 rail 110-2 by longitudinal gap 112-9, the longitudinal gaps fabricated to form the substantially parallel longitudinal axes (in the y direction) of the RF rail 108-1, the MW rail 110-2, and/or the GND rail 107. In some examples, the gaps can be at least partially filled with an insulating material (e.g., a dielectric material).

The GND rails can be configured to provide a relatively stable location in a potential well for the at least one ion 104 above an upper surface of the DC electrodes, the MW rails, the RF rails, and/or the GND rails. For example, the GND rails can be fabricated to occupy a longitudinal region substantially equidistant from the two sequences of DC electrodes and to form a separation between a first number of the MW rails and/or RF rails and a second number of the MW rails and/or RF rails. Such a GND rail can serve to dampen unintended variations (noise) in the electrical and/or magnetic fields. The GND rails (e.g., GND rail 107) can contribute to control and/or stabilization the location of the at least one ion 104 by providing a zeroed reference point that sets a particular distance (height) (e.g., from around 20 microns to around 50 microns) at which the at least one ion 104 is trapped above the upper surface (e.g., the upper surface of GND rail 107).

Figure 2:
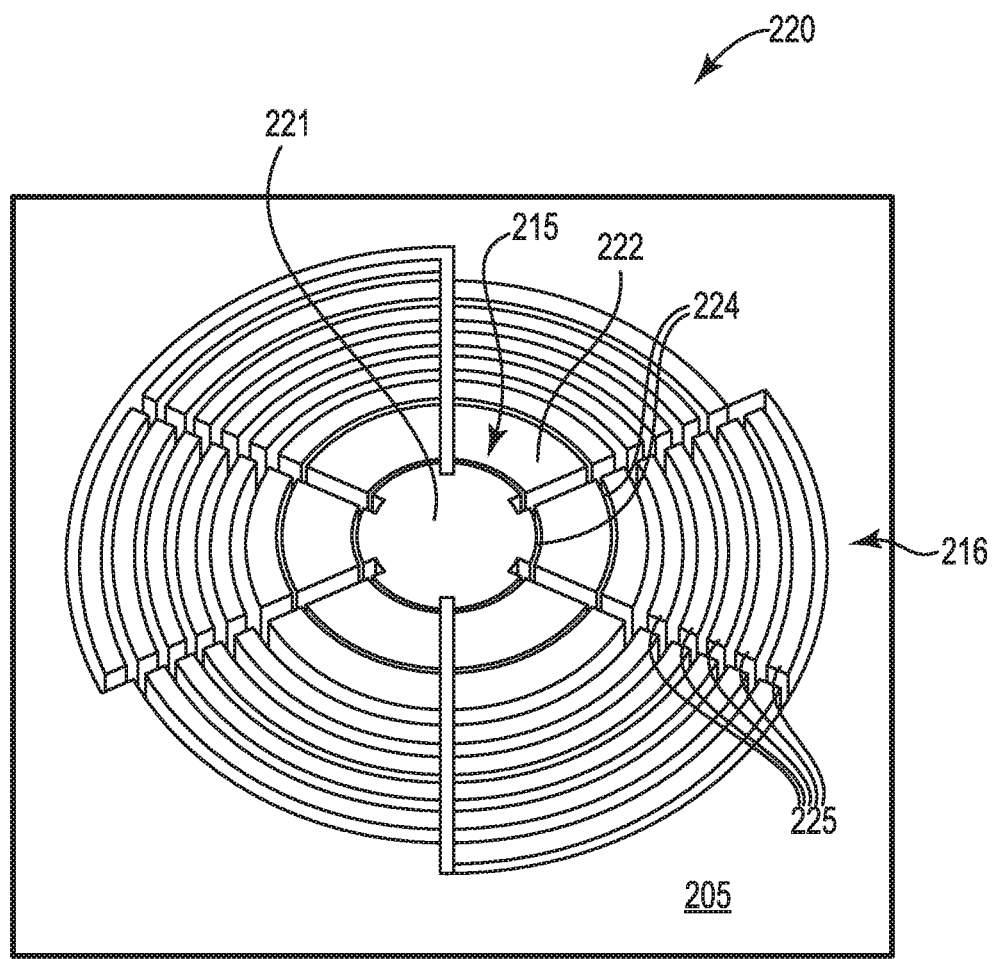
FIG. 2 illustrates a perspective view of a through-silicon via (TSV) and a trench capacitor of an ion trap in accordance with one or more embodiments of the present disclosure.

FIG. 2 illustrates a perspective view of a TSV and a trench capacitor of an ion trap in accordance with one or more embodiments of the present disclosure. FIG. 2 illustrates an embodiment of a device 220 for providing a stabilized electrical potential to a DC electrode of an ion trap, as described herein.

The device 220 includes a TSV 215 formed in a substrate 205 and a trench capacitor 216 formed around the TSV 215 in the substrate 205. The substrate 205 can be a conductive material, for instance. In some embodiments, the substrate 205 can be silicon (e.g., a silicon wafer).

The TSV 215 can include a core 221 and a ring 222. The core 221 can be a conductive material, for instance. In some embodiments, the core 221 can be silicon, though embodiments of the present disclosure are not so limited. The ring 222 can be a conductive material, such as polysilicon, for instance, though embodiments of the present disclosure are not so limited. Between the core 221 and the ring 222, and between the ring 222 and the substrate 205, can be a dielectric material 224. In some embodiments, the dielectric material can be silicon dioxide (e.g., formed by thermal oxidation), for instance, though embodiments of the present disclosure are not so limited.

The TSV 215 can extend through the substrate 205. That is, the TSV can have a height (or depth) equal to a thickness of the substrate 205 (e.g., from around 50 microns to around 500 microns). In some embodiments, the TSV 215 can have a height of from around 50 microns to around 500 microns. In some embodiments, the TSV 215 can have a height of approximately 300 microns.

The trench capacitor 216 can extend partially through the substrate 205. That is, the trench capacitor can have a height (or depth) of less than the thickness of the substrate 205. In some embodiments, the trench capacitor 216 can have a depth of from around 50 microns to around 250 microns. In some embodiments, the trench capacitor 216 can have a height of approximately 65 microns. Embodiments of the present disclosure do not limit trench capacitors to a particular height.

The trench capacitor 216 can include a plurality of annular rings 225 (herein referred to as "rings 225"). Each of the rings 225 can be a different distance from the TSV 215 (e.g., from a center of the TSV 215). In some embodiments, a distance between each of the rings 225 (e.g., incremental distances from a center of the rings) can be constant. In some embodiments, a distance between one of the rings 225 and an adjacent one of the rings 225 can be from around 2 to around 25 microns. In some embodiments, a distance between one of the rings 225 and an adjacent one of the rings 225 can be approximately 6 microns. In some embodiments, a distance between an outermost one of the rings 225 and the TSV 215 (e.g., a center of the core 221 of the TSV 215) can be from around 50 to around 70 microns.

Though the embodiment has six rings 225 as illustrated in FIG. 2, embodiments of the present disclosure are not so limited. Additionally, though the rings 225 are shown in FIG. 2 as each completely encircling the TSV 215, some embodiments include one or more of the rings 225 partially (e.g., not fully) encircling the TSV 215. The rings 225 can be fabricated by removing portions of the substrate 205 (e.g., by an etching technique, such as DRIE). Vacancies (e.g., trenches, openings, etc.) in the substrate defined by the rings can be filled with a conductive material. The conductive material can be polysilicon (e.g., 1E19/cmA3 boron-doped polysilicon, for instance), though embodiments of the present disclosure are not so limited.

Trench capacitors 216 can be configured with a capacitance high enough to reduce unintended variation of an electrical field to which an associated DC electrode contributes, for example, by reducing unintended variation (noise) in an electrical potential from a source of an electrical potential connected to the number of TSVs (e.g., the interposer die described in connection with FIG. 3). In some embodiments, the trench capacitor 216 can have a capacitance of approximately 100 picofarads (e.g., from around 50 to around 150 picofarads). In some embodiments, the trench capacitor 215 can have a capacitance of approximately 200 picofarads (e.g., from around 150 to around 250 picofarads). In some embodiments, the trench capacitor 215 can have a capacitance of approximately 400 picofarads (e.g., from around 250 to around 600 picofarads).

Figure 3:
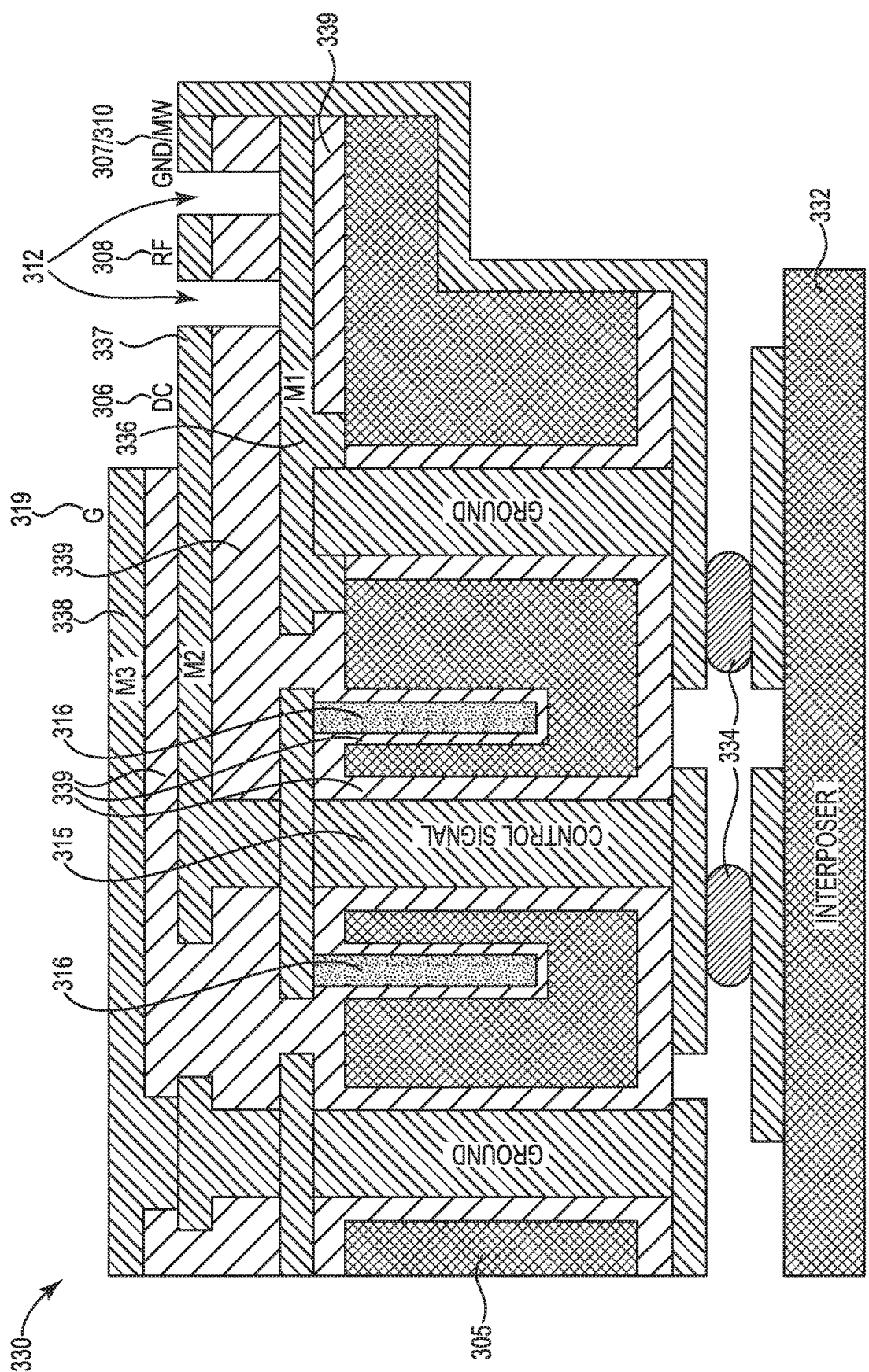
FIG. 3 illustrates a cross-sectional view of a portion of an ion trap in accordance with one or more embodiments of the present disclosure.

FIG. 3 illustrates a cross-sectional view of a portion of an ion trap in accordance with one or more embodiments of the present disclosure. In some embodiments, FIG. 3 can illustrate a portion of a system 330 for trapping ions in accordance with one or more embodiments of the present disclosure. As shown, the system 330 includes a substrate 305 comprising a TSV 315 and a trench capacitor 316. The TSV 315 and the trench capacitor 316 are illustrated schematically and not in the detail shown in FIG. 2.

The substrate 305 can be bonded to an interposer 332 with a plurality of bond pads 334. The bond pads 334 can be a conductive material (e.g., gold, among other conductive materials described herein). Embodiments of the present disclosure can allow optical access to the system 330 by using the bond pads 334 to bond the substrate 305 to the interposer 332 instead of using wire bonds that connect directly to the substrate 305 as in previous approaches.

Formed on the substrate 305 (e.g., above in the z direction shown in FIG. 1A) can be a sequential plurality of (e.g., three) planar conductive materials, for example, a first planar conductive material (M1) 336, a second planar conductive material (M2) 337, and a third planar conductive material (M3) 338. Each of the planar conductive materials 336, 337, 338 can be separated by a dielectric material 339 (e.g., silicon dioxide, although embodiments are not so limited), which also can separate elements of the TSV 315 and/or the trench capacitor 316. In some embodiments, the planar conductive materials 336, 337, 338 can be gold. Each of the planar conductive materials 336, 337, 338 can be fabricated to a thickness of from around 1 micron to around 10 microns. The first planar conductive material 336 can form a ground plane, the second planar conductive material 337 can form a signal routing plane, and the third planar conductive material 338 can form a ground connection (G) 319 plane and/or a DC rotate rail plane, as described further herein.

The G 319 plane can correspond to the G plane areas 119-1, 119-2 shown on both sides (in the x direction) of the top view of the ion trap 102 in FIG. 1A. DC rotate rails 118-1, 118-2 are shown between the G plane areas 119-1, 119-2 and the two sequences of DC electrodes 106-1, 106-2 in FIG. 1A, although, as described further herein, the DC rotate rails can be positioned above the two sequences of DC electrodes. DC rotate rail 118-1 can be separated (e.g., insulated) from G plane area 119-1 by longitudinal gap 112-7 (in the y direction) and DC rotate rail 118-2 can be separated from G plane area 119-2 by longitudinal gap 112-8. In some examples, the gaps for the DC rotate rails can be at least partially filled with an insulating material (e.g., a dielectric material).

The signal routing plane 337 can be used for connecting each DC electrode 306 to a respective TSV 315 and trench capacitor 316 to provide and/or control the electrical potential thereof (e.g., as supplied by the interposer 332). In various embodiments, the signal routing plane 337 can be used for connecting and/or controlling potentials and electrical and/or magnetic fields of a number of RF rails 308, a number of MW rails 310, and/or a number of GND rails 307. The DC electrodes 306, RF rails 308, MW rails 310, and/or GND rails 307 can each be separated by a longitudinal gap 312 (in the y direction in FIG. 1A) that can extend from a top of the second planar conductive material 337 (or a top of a dielectric material formed thereon) to or into the ground plane of the first planar conductive material 336 (or through a dielectric material formed thereon).

The interposer 332 can, in various embodiments, control the operation of the system 330 by supplying and/or controlling static DC current to bias the DC electrodes and an alternating current (AC) for the RF rails and/or the MW rails to create oscillating electrical and/or magnetic fields to trap at least one ion above the surface of the system 330 (e.g., above the surface of the signal routing plane formed by the second planar conductive material 337). The interposer 332 can supply and/or control the appropriate potential and/or current through a planar conductive material within and/or operatively connected to the TSV 315 and/or the trench capacitor 316.

For example, the second planar conductive material 337 can be fabricated, in various embodiments, in the TSV 315 (e.g., in the core 221 and/or the ring 222 shown in FIG. 2) and can be connected to the second planar conductive material 337 from which the number of DC electrodes 306, the number of RF rails 308, the number of GND rails 307, and/or the number of MW rails 310 are formed to supply and/or control signals sent to these components. The trench capacitor 316 associated with the TSV 315 can store enough charge (capacitance) to produce an electrical field to be operatively connected to the second planar conductive material 337 so as to reduce unintended variation of an electrical field to which an associated DC electrode, among other components, contributes. As shown in FIG. 3, a trench capacitor 316 can have an upper surface formed from the first planar conductive material 336 that is below the second planar conductive material 337, although embodiments are not so limited.

As such, a number of TSVs 315 fabricated to supply and/or control signals sent to the DC electrodes, among other components, can be formed with upper surfaces at or below the substantially coplanar upper surfaces of the DC electrodes, the MW rails, the RF rails, and/or the GND rails formed from the second planar conductive material 337. A number of trench capacitors 316 fabricated around at least one TSV 315 can be formed in and/or above the substrate 305 with an upper surface at or below the substantially coplanar upper surfaces of the DC electrodes, the MW rails, the RF rails, and/or the GND rails.

Accordingly, an ion trap apparatus 100, 102, as described herein, can include a number of MW rails 110-1, 110-2, 110-3 and a number of RF rails 108-1,108-2, which can be formed (e.g., each formed) with substantially parallel longitudinal axes and with substantially coplanar upper surfaces. The apparatus can include two sequences of DC electrodes 106-1, 106-2 with each sequence formed to extend substantially parallel to the substantially parallel longitudinal axes of the MW rails and the RF rails. The apparatus can further include a number of TSVs 115, 215, 315 formed through the substrate 205, 305 of the ion trap and a trench capacitor 116, 216, 316 formed in the substrate around at least one TSV.

In various embodiments, the two sequences of DC electrodes 106-1, 106-2 can be configured to be biased with DC voltages (e.g., as a plurality of matched DC electrodes) that contribute, by conduction of static currents, to a combined electrical field and/or magnetic field to trap at least one ion 104 in a potential well (e.g., in variable locations) above at least one of either an upper surface of the DC electrodes, the MW rails, and/or the RF rails. The number of RF rails 108-1,108-2 can, in various embodiments, be configured to conduct an oscillating current, at a frequency less than that conducted by the MW rails, to contribute to a variable combined electrical field and/or magnetic field to trap the at least one ion in the potential well above the at least one of either the DC electrodes, the MW rails and the RF rails. The number of MW rails 110-1, 110-2, 110-3 can, in various embodiments, be configured to conduct an oscillating current, at a frequency higher than that conducted by the RF rails, to contribute to (e.g., cause) transition between quantum states of the at least one ion in the potential well above the at least one of either the MW rails or the RF rails.

The number of TSVs 115, 215, 315 formed through the substrate can, in various embodiments, be configured to provide an electrical potential to the DC electrodes (e.g., each of the DC electrodes) in the two sequences of DC electrodes 106-1, 106-2. The trench capacitor 116, 216, 316 formed in the substrate can, in various embodiments, be configured with a capacitance to reduce unintended variation of an electrical field to which an associated DC electrode contributes.

In various embodiments, the apparatus 111 can further include a number of GND rails 107 formed between the two sequences of DC electrodes 106-1, 106-2, the GND rails formed as substantially parallel to the substantially parallel longitudinal axes of the two sequences of DC electrodes, the MW rails, and/or the RF rails. The number of GND rails 107 can be formed (e.g., each formed) with an upper surface substantially coplanar with upper surfaces of the MW rails, the RF rails, and/or the DC electrodes. The number of GND rails 107 can be configured to (e.g., at least one GND rail configured to) provide a relatively stable location in the potential well for the at least one ion above the upper surface of the DC electrodes, the MW rails, the RF rails, and/or the GND rails.

Figure 4:
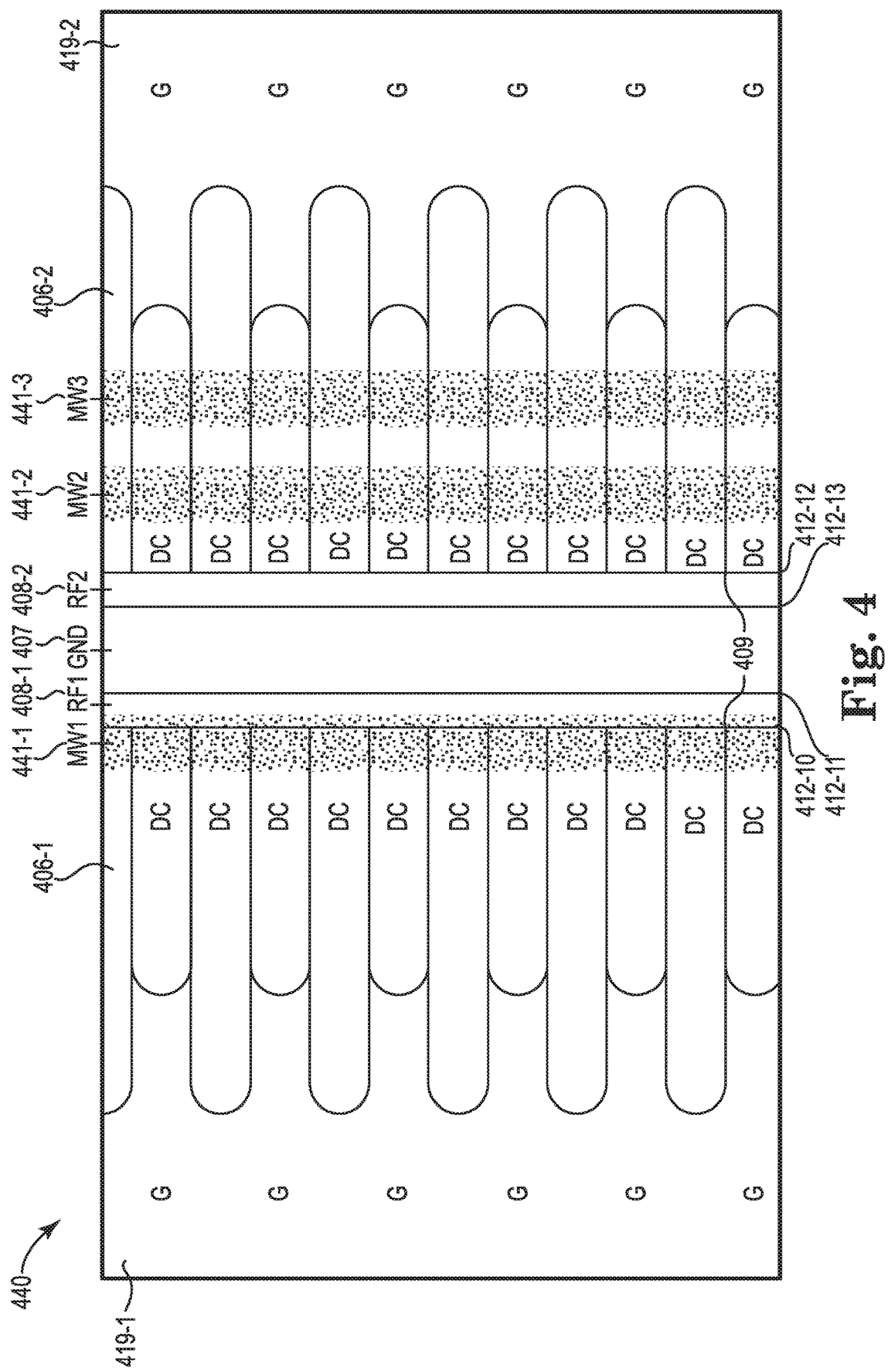
FIG. 4 illustrates another top view of a portion of an ion trap in accordance with one or more embodiments of the present disclosure.

FIG. 4 illustrates another top view of a portion of an ion trap in accordance with one or more embodiments of the present disclosure. Ion traps consistent with the embodiment of the ion trap 440 illustrated in FIG. 4 and embodiments of ion traps illustrated subsequently can differ from embodiments previously presented concerning, for instance, relative positioning of MW rails with regard to positioning of other components, for instance, DC electrodes, RF rails, GND, rails, etc. For example, MW rails 110-1, 110-2, 110-3, 310 are shown and described in connection with FIGS. 1A-1B and 3 as being fabricated from the second planar conductive material 337, which is fabricated above the first planar conductive material 336 and the upper surface of the substrate 305, along with other components such as DC electrodes, RF rails, GND, rails, etc. By comparison, MW rails MW1 441-1, MW2 441-2, MW3 441-3 illustrated in FIG. 4, and corresponding MW rails illustrated subsequently, are described as being fabricated in the substrate 305 so as to be below (e.g., in the z direction as shown in FIG. 1A) the first planar conductive material 336.

As illustrated in connection with FIGS. 8-10, the ion trap 440 shown in FIG. 4 can be fabricated on and in the substrate, for example, as shown at 805 in FIG. 8. For example, the substrate 805 can be formed on and/or from a silicon wafer, which can, in various embodiments, have a thickness in a range of from around 50 microns to around 500 microns.

In various embodiments, a number of RF rails (e.g., RF1 408-1, RF2 408-2) and/or GND rails (e.g., GND 407) can be fabricated above an upper surface of the substrate. A number of MW rails (e.g., MW1 441-1, MW2 441-2, MW3 441-3) can be fabricated below the upper surface of the substrate (e.g., below the first planar conductive material 336, dielectrics, insulators, shields, etc., formed on and/or above the upper surface of the substrate). The MW rails are shown as stippled to indicate being below the first planar conductive material 336.

As shown in FIG. 4, each of the RF rails, GND rails, and/or MW rails can be formed with substantially parallel longitudinal axes (in the y direction as shown in FIG. 1A) and/or with substantially coplanar upper surfaces (relative to a line in the x direction). In some embodiments, each of the DC electrodes in the two sequences of DC electrodes 406-1 and 406-2 above the upper surface of the substrate can be formed with substantially coplanar upper surfaces that are substantially coplanar with the upper surfaces of the RF rails and/or GND rails.

One GND rail, two RF rails, and three MW rails are illustrated in FIG. 4 and other figures of the present disclosure, although embodiments are not limited to these numbers and configurations of GND rails, RF rails, and MW rails. That is, the GND rails, RF rails, and/or MW rails can be fabricated in various configurations such that the number, the heights (in the z direction), and/or the widths (in the x direction) of such rails can be varied as suitable for particular applications.

The order (in the x direction) in which the GND rails, RF rails, and/or MW rails are fabricated also can be varied. That is, a position in a sequence of such rails, as viewed from the top, can be varied such that a pair of MW rails may be adjacent each other and/or a pair of MW rails may be separated by at least one GND rail and/or RF rail and similarly with regard to the GND rails and RF rails relative to the MW rails.

In addition, as viewed from the top, positions of MW rails can appear to overlap with the sequences of DC electrodes, the RF rails, and/or the GND rails. That is, as shown in FIG. 4 and other figures of the present disclosure, a position of at least one of the MW rails may overlap (in the x direction) with and/or be covered by the positions of the DC electrodes, DC rotate rails, GND rails and/or RF rails because the MW rails are fabricated below the surface of the substrate whereas the DC electrodes, DC rotate rails, GND rails and/or RF rails are fabricated above the surface of the substrate. For example, the position of the MW1 rail 441-1 is shown to overlap (in the x direction) the position of the RF1 rail 408-1 and both the MW2 rail 441-2 and the MW3 rail 441-3 are covered by (e.g., completely underneath) the sequence of DC electrodes 406-2. The positions of the MW rails being overlapped and/or covered by the positions of the DC electrodes, DC rotate rails, GND rails and/or RF rails can, for instance, contribute to narrowing the ion trap region between the DC electrodes.

In various embodiments, three or more MW rails may be asymmetrically positioned (in the x direction), as illustrated in FIG. 4 and other figures of the present disclosure, such that there are, for example, two adjacent MW rails (e.g., 441-2, 441-3) and one MW rail (e.g., 441-1) separated from the two adjacent MW rails by a number of GND rails (e.g., 407) and/or RF rails (e.g., 408-1, 408-2). Moreover, the three or more MW rails may be asymmetrically positioned (in the x direction) relative to a centerline (not shown) in the separation distance between the two sequences of DC electrodes. For example, the three MW rails 441-1, 441-2, 441-3 shown in FIG. 4 may each have a width (in the x direction) of 60 microns and a centerline (not shown) of MW1 rail 441-1 may be offset in a direction of the G plane 419-1 from the centerline of the DC electrodes by a distance of 100 microns. A centerline (not shown) of MW2 rail 441-2 may be offset in the direction of the G plane 419-2 from the centerline of the DC electrodes by a distance of 150 microns and a centerline (not shown) of MW3 rail 441-3 may be offset in the direction of the G plane 419-2 by a distance of 250 microns.

Asymmetric positioning of the three MW rails relative to the centerline in the separation distance between the two sequences of DC electrodes may contribute to providing a low net MW field strength (e.g., approximately zero) at a position between the two sequences of DC electrodes at which the at least one ion may be trapped while enabling a strong MW gradient to be created in the ion trap region between the DC electrodes. Alternatively and/or in addition, the asymmetric positioning of the three MW rails may contribute to enabling various different MW field strengths (e.g., a combination of electrical field strengths and/or magnetic field strengths) between the two sequences of DC electrodes to affect spin transitions (e.g., transition between quantum states) of at least one ion in a potential well.

Adjacent GND lines, RF rails, and/or sequences of DC electrodes formed above the substrate each can be separated (e.g., insulated) by a longitudinal gap (e.g., longitudinal gaps 412-10, 412-11, 412-12, 412-13), as described further herein, fabricated to form substantially parallel longitudinal axes (in the y direction) of the GND rail 407, RF rails 108-1, 108-2, and/or the two sequences of DC electrodes 406-1, 406-2. Similarly, each of the DC electrodes in the two sequences of DC electrodes 106-1, 106-2 can be separated (e.g., insulated) from each other by each being fabricated with a horizontal gap between adjacent DC electrodes (e.g., horizontal gaps 409 in the x direction). In some examples, the longitudinal gaps and/or horizontal gaps can be at least partially filled with an insulating material (e.g., a dielectric material). In some embodiments, the dielectric material can be silicon dioxide (e.g., formed by thermal oxidation), for instance, although embodiments of the present disclosure are not so limited.

Figure 5:
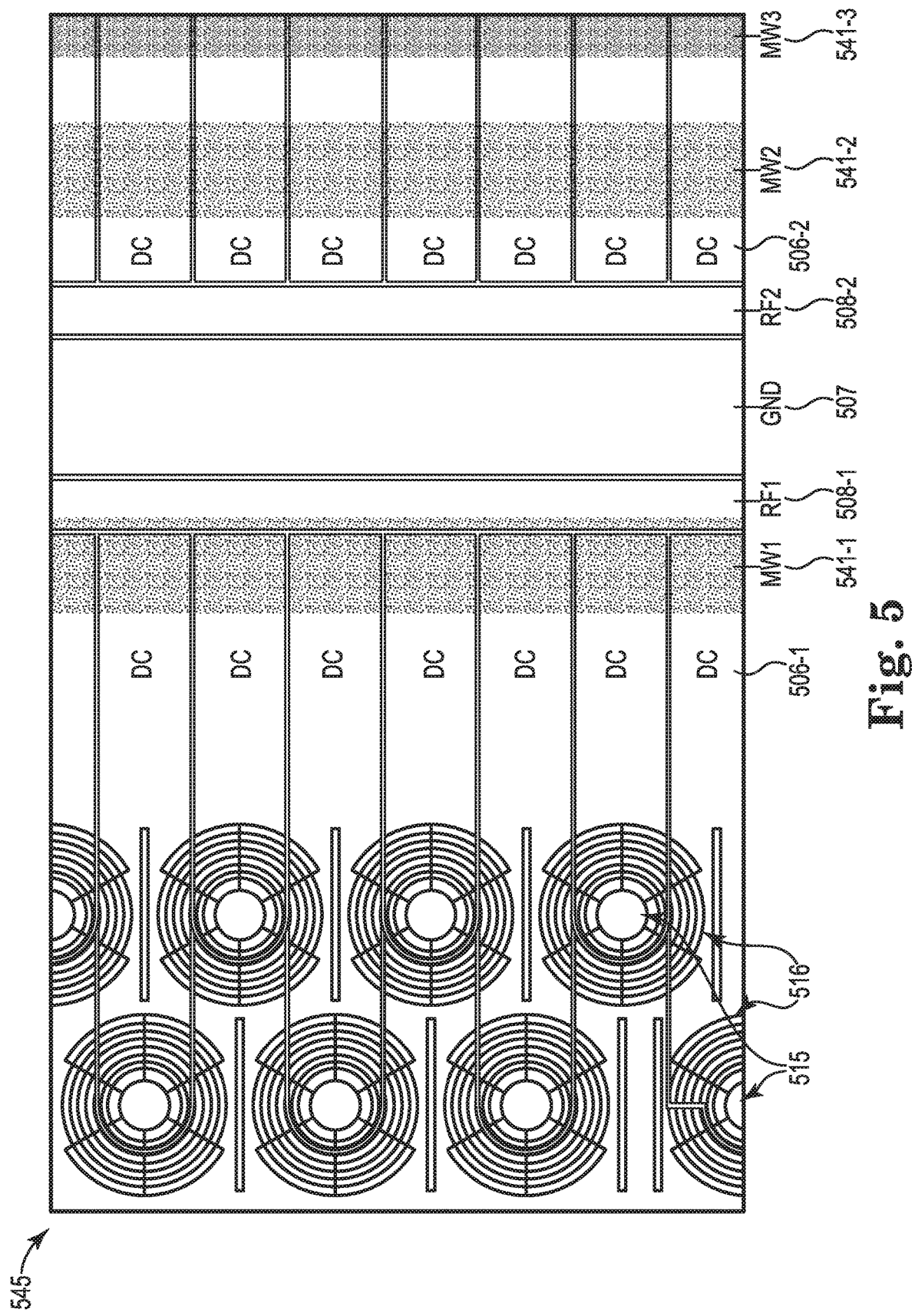
FIG. 5 illustrates another top view of a portion of an ion trap in accordance with one or more embodiments of the present disclosure.

FIG. 5 illustrates another top view of a portion of an ion trap in accordance with one or more embodiments of the present disclosure. The embodiment of the ion trap 545 illustrated in FIG. 5 shows components and positioning of components consistent with those illustrated in FIG. 4, although embodiments are not so limited.

The two sequences of DC electrodes 506-1, 506-2 shown in FIG. 5 can be fabricated as a plurality of matched DC electrodes. For example, as shown in ion trap 100 in FIG. 1A, electrode DC1 of the first sequence of DC electrodes 106-1 can be matched with electrode DC2 of the second sequence of DC electrodes 106-2, electrode DC3 can be matched with electrode DC4, electrode DC5 can be matched with electrode DC6, and so on for the two sequences of DC electrodes 106-1, 106-2.

As illustrated in the ion trap 545 of FIG. 5, a particular TSV 515 that is associated with a particular trench capacitor 516 to supply and/or control signals sent through the second planar conductive material 337 to the DC electrodes can be connected to each DC electrode fabricated from the second planar conductive material 337, as shown for sequence of DC electrodes 506-1, and as described in connection with FIGS. 2 and 3. As shown in FIG. 5, the TSVs 515 and associated trench capacitors 516 can be positioned in the substrate out beyond the MW rails (in the x direction toward the G plane 419-1 in FIG. 4), although embodiments are not so limited (e.g., as shown in FIG. 8 for MW rails 841-2, 841-3 in the substrate 805 relative to the sequence of DC electrodes 806-2 above the substrate).

Figure 6:
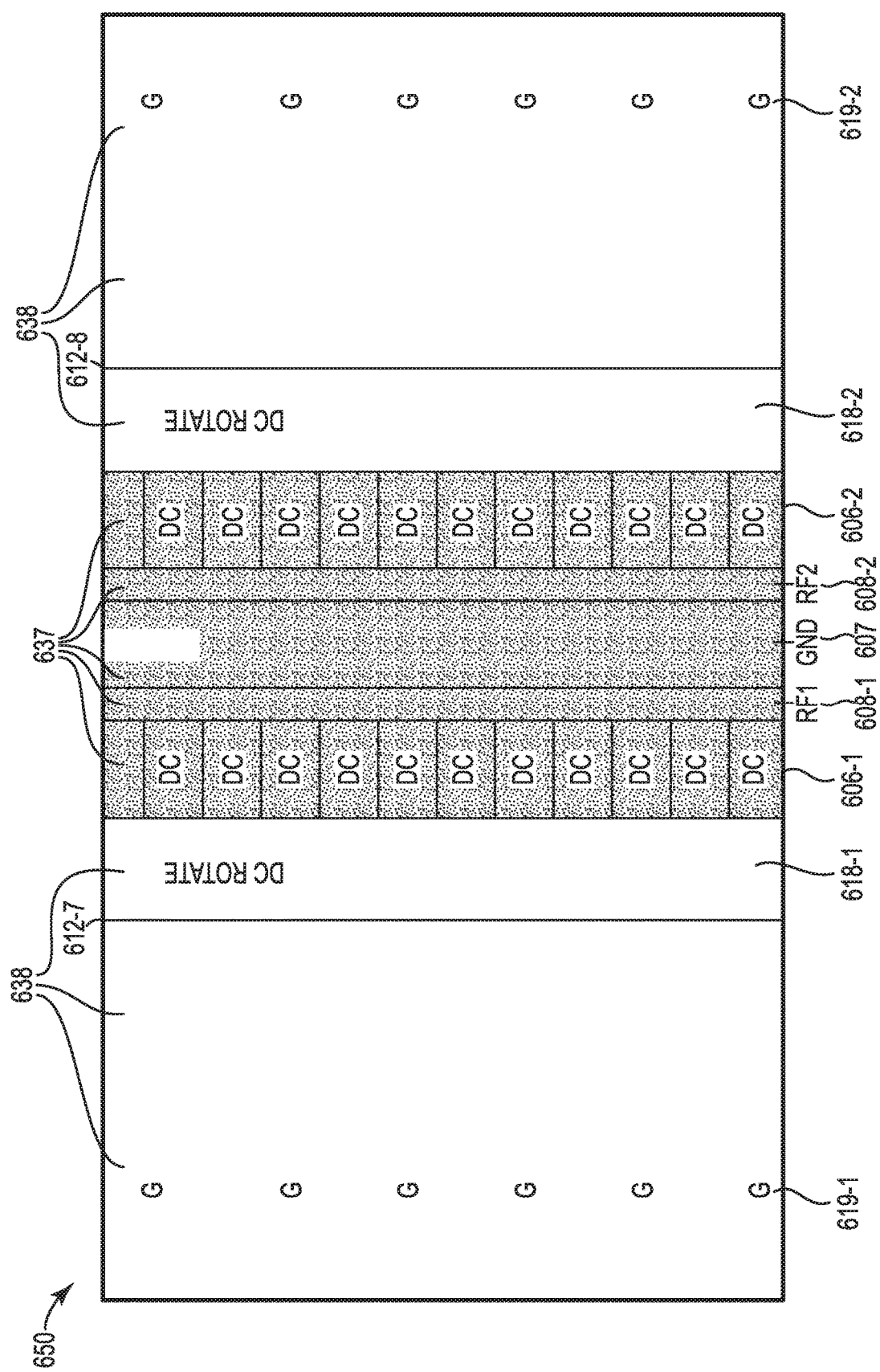
FIG. 6 illustrates another top view of a portion of an ion trap in accordance with one or more embodiments of the present disclosure.

FIG. 6 illustrates another top view of a portion of an ion trap in accordance with one or more embodiments of the present disclosure. The embodiment of the ion trap 650 illustrated in FIG. 6 can include components and positioning of components consistent with those illustrated in FIGS. 4 and 5, although embodiments are not so limited. However, for purposes of clarity, the ion trap 650 illustrated in FIG. 6 does not show components positioned in the substrate and/or under the first planar conductive material 336 (e.g., MW rails 441-1, 441-2, 441-3 shown in FIG. 4 and MW rails 841-1, 841-2, 841-3 shown in FIG. 8). Nor does FIG. 6 show elements under the third planar conductive material 638, from which the DC rotate rails 618-1, 618-2 and the G planes 619-1, 619-2 are formed.

In addition, FIG. 6 illustrates a first DC rotate rail 618-1 positioned longitudinally (in the y direction in FIG. 1A) above horizontally oriented DC electrodes of a first longitudinal sequence of DC electrodes 606-1 and a second DC rotate rail 618-2 positioned longitudinally above horizontally oriented DC electrodes of a second longitudinal sequence of DC electrodes 606-2. Each longitudinal DC rotate rail 618-1, 618-2 can be fabricated from the third planar conductive material 638 from which an adjacent G plane 619-1, 619-2 is fabricated, as described in connection with FIG. 3.

In various embodiments, DC rotate rails can be fabricated to carry a static DC current intended to reduce unintended variation of an electrical field to which the number of DC electrodes in an underlying sequence of DC electrodes contributes by reducing unintended variations in electrical potentials of the DC electrodes (e.g., based upon manufacturing differences between DC electrodes in length, width, height, composition, etc.). In various embodiments, DC rotate rails can be formed in various widths (in the x direction), for example, ranging from around 50 microns to around 150 microns.

As shown in FIG. 6, each of the DC rotate rails 619-1, 618-2 and the vertically stacked sequence of DC electrodes 606-1, 606-2 with which the DC rotate rail is associated can be formed with substantially parallel longitudinal axes (in the y direction). In some embodiments, each of the DC rotate rails 619-1, 618-2 can be formed with substantially coplanar upper surfaces (relative to a line in the x direction) that are substantially coplanar with the upper surface of a laterally positioned G plane 619-1, 619-2. In some embodiments, the G planes 619-1, 619-2 may extend (in the x and y directions) to the outside edges of the ion trap 650.

In some embodiments, a DC rotate rail (e.g., DC rotate rail 618-1) can be positioned adjacent a G plane (e.g., G plane 619-1) and separated (e.g., insulated) therefrom by a longitudinal gap (e.g., longitudinal gap 612-7 in the y direction). Such a longitudinal gap can be formed from an upper surface of the third planar conductive material 638 (or through a top of a dielectric material formed thereon) to or into the second planar conductive material 637 (or a dielectric material formed thereon) from which, for example, the DC electrodes are formed. In some examples, the longitudinal gaps for the DC rotate rails can be at least partially filled with an insulating material (e.g., a dielectric material). In some embodiments, the DC rotate rails can be positioned to leave a larger gap than shown in FIG. 6 between the closest G plane (e.g., DC rotate rail 618-1 being shifted toward RF1 608-1), in which case use of an insulating material may be reduced.

Figure 7:
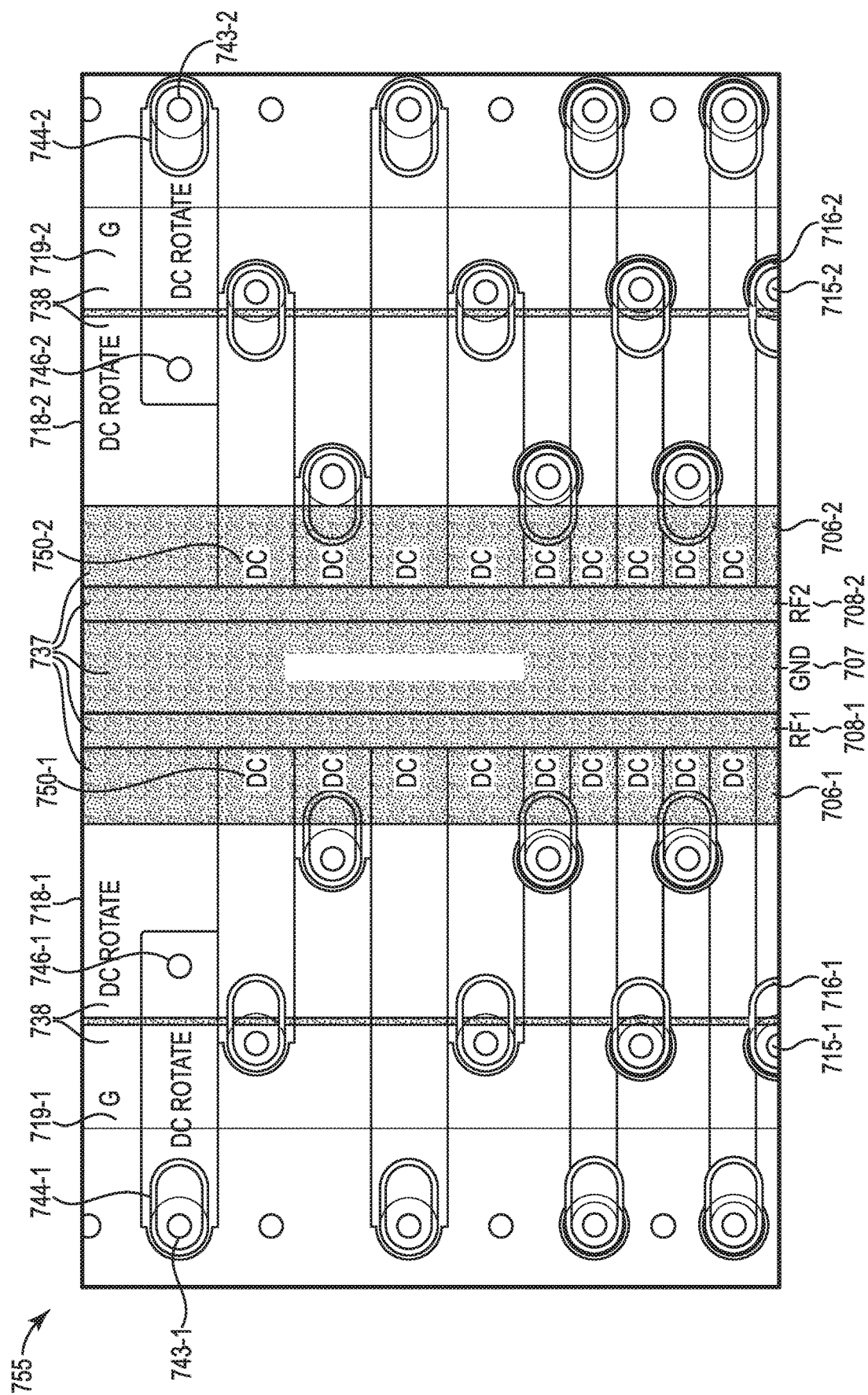
FIG. 7 illustrates another top view of a portion of an ion trap in accordance with one or more embodiments of the present disclosure.

FIG. 7 illustrates another top view of a portion of an ion trap in accordance with one or more embodiments of the present disclosure. The embodiment of the ion trap 755 illustrated in FIG. 7 can include components and positioning of components consistent with those illustrated in FIGS. 4-6, although embodiments are not so limited. For purposes of clarity, the ion trap 755 illustrated in FIG. 7 does not show components positioned in the substrate and/or under the first planar conductive material 336 (e.g., MW rails 441-1, 441-2, 441-3 shown in FIG. 4 and MW rails 841-1, 841-2, 841-3 shown in FIG. 8). However, FIG. 7 does show elements under the third planar conductive material 738, from which the DC rotate rails 718-1, 718-2 and/or the G planes 719-1, 719-2 are formed.

In addition, the top view of the portion of the ion trap 755 is shifted upward (in the y direction) relative to the top views of the ion traps shown in FIGS. 4-6. As such, FIG. 7 shows a first DC electrode 750-1 at a longitudinal end (upper end in the y direction) of the first sequence of DC electrodes 706-1 and a second DC electrode 750-2 at a longitudinal end of the second sequence of DC electrodes 706-2.

A second number of TSVs (e.g., TSVs 743-1, 743-2) can, in various embodiments, be fabricated (e.g., using a technique such as DRIE, among others) through the substrate of the ion trap 755 and connected to the second planar conductive material 737, where a second number of trench capacitors 744-1, 744-2 can be fabricated in the substrate material around the second number of TSVs (e.g., each of TSVs 743-1, 743-2). The second number of TSVs 743-1, 743-2 can be fabricated longitudinally proximate to (in the y direction) at least one DC electrode 750-1, 750-2 at the longitudinal ends of the sequences of DC electrodes 706-1, 706-2 (e.g., longitudinally adjacent but not within the sequences of DC electrodes).

The second number of TSVs 743-1, 743-2 and trench capacitors 744-1, 744-2 can be similarly fabricated in and through the substrate to the manner in which the first number of TSVs 715-1, 715-2 and trench capacitors 716-1, 716-2 is fabricated in order to provide and/or control electrical potential supplied by the interposer 332. The first number of TSVs 715-1, 715-2 and trench capacitors 716-1, 716-2, however, provide and/or control electrical potential through the second planar conductive material 737 to the DC electrodes formed from the second planar conductive material. In contrast, the second number of TSVs 743-1, 743-2 and trench capacitors 744-1, 744-2 provide and/or control electrical potential through the second planar conductive material 737 to the DC remote rails 718-1, 718-2 formed from the third planar conductive material 738, which can be the same conductive material from which the G planes 719-1, 719-2 are formed.

The second planar conductive material 737 connected to the second number of TSVs 743-1, 743-2 can, in various embodiments, enable the second number of TSVs 743-1, 743-2 (and the associated trench capacitors 744-1, 744-2) to be individually connected by a number of vias 746-1, 746-2 to a longitudinal DC rotate rail 718-1, 718-2 formed from the third conductive material 738 to reduce unintended variation of an electrical field to which the number of DC electrodes contributes. In various embodiments, the vias 746-1, 746-2 can be formed through a dielectric material 339 that separates (e.g., insulates) (e.g., silicon dioxide, although embodiments are not so limited) the second planar conductive material 737 from the third planar conductive material 738. Although, TSV 743-1 and associated trench capacitor 744-1, for example, are shown as being at a different location from that of the via 746-1 for purposes of clarity, embodiments are not so limited. For example, as shown in FIG. 8, a second TSV 843-1 and associated second trench capacitor 844-1 can be directly under the DC rotate rail 818-1 formed from the third planar conductive material 838, with the second planar conductive material 837, dielectric material 839, and via (not shown) fabricated between the second TSV 843-1 and the DC rotate rail 818-1.

Figure 8:
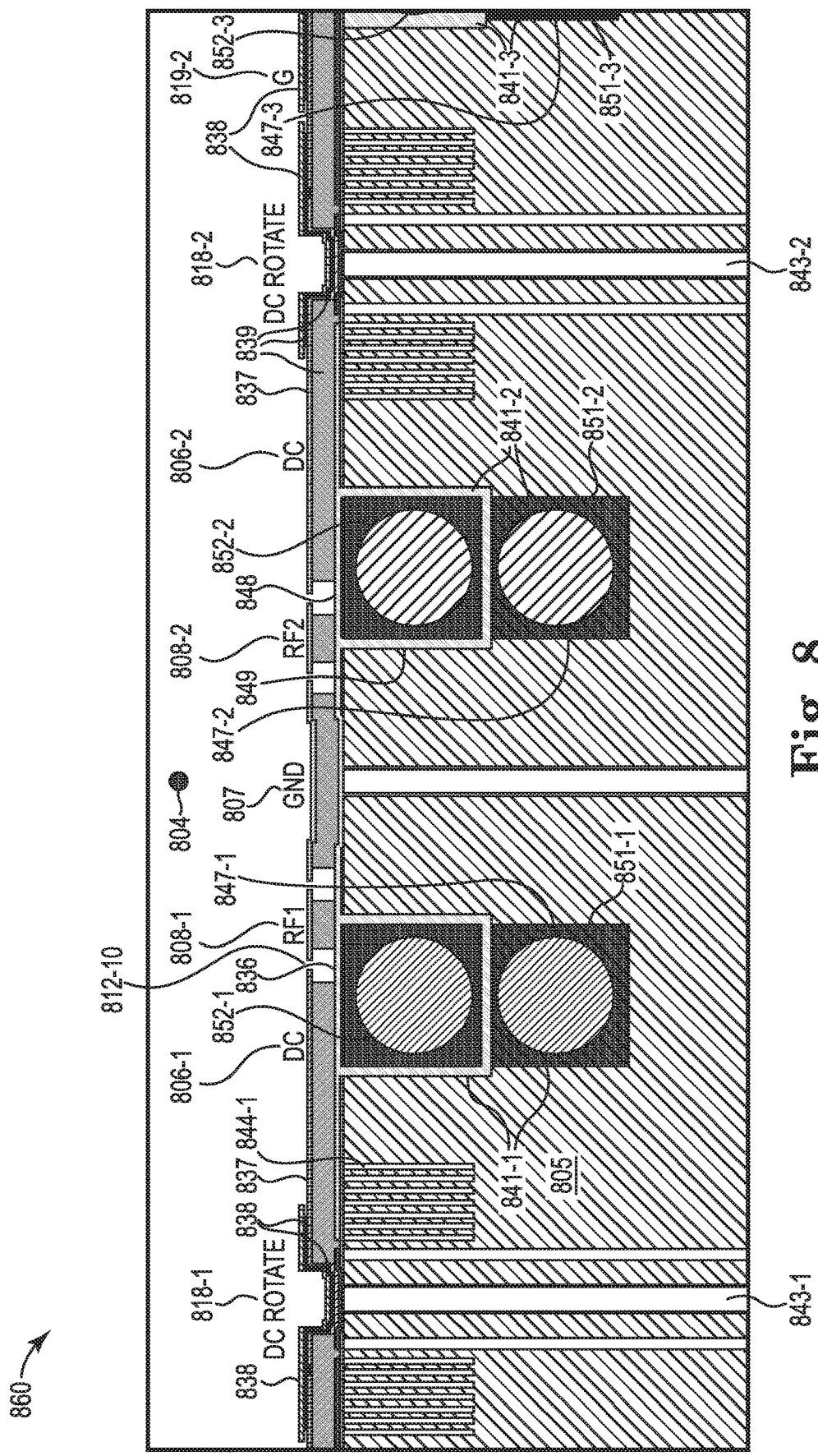
FIG. 8 illustrates another cross-sectional view of a portion of an ion trap in accordance with one or more embodiments of the present disclosure.

FIG. 8 illustrates another cross-sectional view of a portion of an ion trap in accordance with one or more embodiments of the present disclosure. The embodiment of the ion trap 860 illustrated in FIG. 8 can include components and positioning of components consistent with those illustrated in FIGS. 4-7, although embodiments are not so limited. For purposes of illustration, the cross-sectional view of the ion trap 860 shown in FIG. 8 cuts through the positions of the second number of TSVs 743-1, 743-2 and the associated trench capacitors 744-1, 744-2 shown in FIG. 7, although, in some embodiments, DC electrodes may not be present past the longitudinal ends of the sequences of DC electrodes as shown at 806-1 and 806-2 in FIG. 8. The RF, MW, and/or GND rails, however, can extend through the cut line, as shown in FIG. 7.

As shown in FIG. 8, the second TSVs 843-1, 843-2 and the associated second trench capacitors 844-1, 844-1 can, in some embodiments, be directly under the two DC rotate rails 818-1, 818-2 formed from the third planar conductive material 838. The second planar conductive material 837, a dielectric material 839, and a via (not shown) can be fabricated between each of the second TSVs 843-1, 843-2 and the DC rotate rail rails 818-1, 818-2.

A number of longitudinal gaps (in the y direction as shown in FIG. 1A) can be formed (e.g., etched) through the second planar conductive material 837 in a number of locations to form the substantially parallel longitudinal RF rails 808-1, 808-2 and/or GND rail 807. For example, longitudinal gap 812-10 can be formed through the second planar conductive material 837 and the dielectric 839 to or into the first planar conductive material 836 to separate (e.g., insulate) the DC electrodes of the first sequence of DC electrodes 806-1 from the first RF rail 808-1. As described herein, the first planar conductive material 836 can be fabricated over an upper surface (in the z direction in FIG. 1A) of the substrate 805. In various embodiments, other materials (e.g., dielectrics, insulators, shields, etc.) can be formed between the substrate 805 and first planar conductive material 836 fabricated above the upper surface thereof. In various embodiments, the other materials (e.g., dielectrics, insulators, shields, etc.) can be formed on an upper surface and/or a lower surface of the first planar conductive material 836.

In various embodiments, a plurality of trenches can be fabricated (e.g., etched) into the substrate 805 to serve as conduits for MW rails. The embodiment of the ion trap 860 illustrated in FIG. 8 shows by way of example three trenches 851-1, 851-2, 851-3 for MW rails fabricated into the substrate 805 below the first planar conductive material 836 at various positions relative to the sequences of DC electrodes 806-1, 806-2, the RF rails 808-1, 808-2, and/or the GND rail 807, although embodiments are not so limited in numbers of components and/or positioning thereof. That is, embodiments of the present disclosure are not limited to the MW rail trenches 851-1, 851-2, 851-3 being formed below the first planar conductive material 836 as shown such that trench 851-1 is partially under the first sequence of DC electrodes 806-1 and partially under the first RF rail 808-1, trench 851-2 is partially under the under the second RF rail 808-2 and partially under the second sequence of DC electrodes 806-2, and trench 851-3 is completely under G plane 819-2, nor is the number of trenches for MW rails and/or the plurality of MW rails limited to three.

As shown in the embodiment of the ion trap 860 illustrated in FIG. 8, each of the trenches 851-1, 851-2, 851-3 can be fabricated as a conduit for MW rails 841-1, 841-2, 841-3, respectively. As described further in connection with FIG. 9, each MW rail can, in various embodiments, be fabricated with an input line and an output line. For example, MW rail 841-2 can include an output line 847-2 fabricated at the bottom of the trench 851-2 with an input line 852-2 fabricated to fill substantially a remainder of the trench 851-2.

The input line and the output line of the MW rail can each be fabricated from a conductive material (e.g., copper, among others described herein) with a cross-sectional height and/or width in a range of from around 10 microns to around 100 microns (e.g., in a circular, oval, square, rectangular, etc., cross-sectional configuration). As such, each trench can be fabricated with corresponding width in a range of from around 10 microns to around 100 microns and a depth in a range of from around 20 microns to around 200 microns, the lower and upper values of such ranges being adjustable to enable fabrication of other materials between the input line and the output line and/or between the input line and/or the output line and boundaries of the trench.

For example, as shown for MW rail 841-2, a dielectric material 849 (e.g., silicon dioxide, among others) can, in various embodiments, be fabricated on the upper surface of the output line 847-2, the uncovered remaining surface of the trench 851-2, and/or the upper surface of the input line 852-2. Such a dielectric material 849 can, for instance, insulate crosstalk between oscillating MW current carried by the input line 852-2 and oscillating MW current carried by the output line 852-1.

Alternatively and/or in addition, a MW shield 848 layer (e.g., formed from copper, gold, and/or superconducting niobium, among other elements and/or alloys) can be fabricated in a thickness in a range of from around 1 micron to around 5 microns above and/or adjacent (in the x direction in FIG. 1A) the upper surface of the input line (e.g., input line 852-2). In various embodiments, the MW shield 848 layer can be fabricated above or below the first planar conductive material 836.

The MW shield 848 layer can, for example, contribute to shunting and/or shielding the input line and/or a magnetic field (Bo) (e.g., as shown at 114 in FIG. 1A) of the associated input line (e.g., input line 852-2) for contribution to trapping and/or quantum state transition of the at least one ion 804. For example, the MW shield 848 layer can be used for shunting and/or shielding the input line and/or the magnetic field (Bo) relative to possible effects of and/or on overlying and/or nearby sequences of DC electrodes, RF rails, and/or GND rails (e.g., sequence of DC electrodes 806-1, RF rail 802-1, and/or GND rail 807 in connection with input line 852-1). In some embodiments, an effect of fabrication of the MW shield 848 layer on a strength of a magnetic field formed by the input line 852-2 can be compensated for by reducing thickness of the first planar conductive material 836 and/or the second planar conductive material 837 in the vicinity of the MW shield 848 layer and/or the input line 852-2.

Accordingly, an ion trap system can, in various embodiments as described herein, include a substrate material (e.g., as shown at 105, 305, etc.) and three sequential planar conductive materials formed above the substrate material. The three sequential planar conductive materials can include a first planar conductive material that forms a ground plane (e.g., as shown at 336, 836, etc.), a second planar conductive material that forms a signal routing plane (e.g., as shown at 337, 637, 837, etc.), and a third planar conductive material (e.g., as shown at 338, 638, 838, etc.) that can, for example, form a G plane (e.g., as shown at 319, 619, 819, etc.). As described herein, the second planar conductive material can be separated from the first planar conductive material and the third planar conductive material by at least one dielectric material (e.g., as shown at 339, 839, etc.). The ion trap system can, in various embodiments, include a first number of TSVs (e.g., as shown at 115, 215, 315, 1015, etc.) formed through the substrate material and a first number of trench capacitors (e.g., as shown at 116, 216, 316, 1016, etc.) formed in the substrate material around at least one of the first number of TSVs.

The ion trap system can, in various embodiments, include a number of longitudinal gaps (e.g., as shown at 112-1 through 112-9, 412-10 through 412-13, etc.) formed in the second planar conductive material, for example, to separate two longitudinal sequences of DC electrodes (e.g., as shown at 106-1 and 106-2, 406-1 and 406-2, etc.) from at least two separate longitudinal RF rails (e.g., as shown at 108-1 and 108-2, 408-1 and 408-2, etc.) positioned between the two longitudinal sequences of DC electrodes. As described herein, the number of longitudinal gaps can, for example, extend from a top surface of the second planar conductive material to at least a top surface of the first planar conductive material (e.g., as shown at 312, 812-10, etc.). The ion trap system can, in various embodiments, include a first number of TSVs (e.g., as shown at 115, 215, 315, 1015, etc.) formed through the substrate material and a first number of trench capacitors (e.g., as shown at 116, 216, 316, 1016, etc.) formed in the substrate material around at least one of the first number of TSVs.

The ion trap system can, in various embodiments, include a number of horizontal gaps (e.g., as shown at 109, 409, etc.)

formed in the two longitudinal sequences of DC electrodes to form two longitudinal sequences of separate DC electrodes. In some embodiments, two longitudinal sequences of matching DC electrodes can be formed, where a chargeable face of each DC electrode in a first sequence is opposed by a chargeable face of the same width (in the y direction in FIG. 1A) of a corresponding DC electrode in a second sequence.

An electrical potential (e.g., voltage) can be provided to a number of DC electrodes in the two longitudinal sequences of DC electrodes by the DC electrodes being connected to the first number of TSVs by the second planar conductive material (e.g., as shown at 306, 315, 337, etc.). The two longitudinal sequences of DC electrodes can, in some embodiments, be connected to the first number of TSVs on an opposite side of the substrate from a source (e.g., interposer die 332) of an electrical potential connected to the first number of TSVs.

The ion trap system can, in various embodiments, include a second number of TSVs (e.g., as shown at 743, 843, 1043, etc.) formed through the substrate material (e.g., as shown at 805, 1005, etc.) and connected to the second planar conductive material (e.g., as shown at 837, 1037, etc.) and a second trench capacitor (e.g., as shown at 744, 844, 1044, etc.) formed in the substrate material around at least one of the second number of TSVs. In some embodiments, the second number of TSVs can be formed longitudinally proximate to at least one DC electrode (e.g., as shown at 750-1 and 750-2, etc.) at longitudinal ends of the sequences of DC electrodes (e.g., as shown at 706-1 and 706-2). That is, the DC electrode (e.g., as shown at 750-1 and 750-2, etc.) proximate to a longitudinal end of one of the sequences may be next to but not within the sequence of DC electrodes.

The second planar conductive material that is connected to the second number of TSVs can, in various embodiments, be connected by a number of vias (e.g., as shown at 746-1 and 746-2, etc.) to a longitudinal DC rotate rail (e.g., as shown at 118, 718, 818, etc.) formed from the third planar conductive material (e.g., as shown at 638, 738, 838, etc.) to reduce unintended variation of an electrical field to which the number of DC electrodes contributes. For instance, the unintended variation of the electrical field can be reduced by reducing unintended variation in an electrical potential of the DC electrode (e.g., based upon manufacturing differences between DC electrodes in length, width, height, composition, etc.).

In various embodiments, the number of longitudinal gaps can be fabricated in the second planar conductive material to separate at least two longitudinal MW rails (e.g., the three MW rails shown at 110, 441, etc.) positioned between the two longitudinal sequences of DC electrodes from the two longitudinal sequences of DC electrodes and the at least two RF rails. In some embodiments, the number of longitudinal gaps (e.g., as shown at 112-3 and 112-9, 412-11 and 412-13, etc.) are formed in the second planar conductive material to separate a longitudinal GND rail (e.g., as shown at 107, 407, 807, etc.) positioned between two RF rails (e.g., as shown at 108-1 and 108-2, 408-1 and 408-2, etc.) from the two longitudinal sequences of DC electrodes and/or the two RF rails. In some embodiments, the longitudinal GND rail can be positioned adjacent two adjacent MW rails that are positioned between the two RF rails (e.g., as shown at 107, 108-1, 108-2, 110-2, 110-3, etc.).

The ion trap system can, in various embodiments, include at least two longitudinal MW rails (e.g., the three MW rails shown at 441, 841, 1041, etc.) positioned (e.g., fabricated) in the substrate below the first planar conductive material (e.g., as shown at 836, 1036, etc.). At least one of the longitudinal MW rails can, in some embodiments, be fabricated to include an input line (e.g., as shown at 852, 952, 1052, etc.) for input of an oscillating MW current and an output line (e.g., as shown at 847, 947, 1047, etc.) for output of the oscillating MW current. The input line can be positioned more proximate to the first planar conductive material (e.g., as shown at 836, 1036, etc.) than the output line. That is, in some embodiments, the input line and the output line can be vertically stacked with the input line closer to the first planar conductive material.

Figure 9:
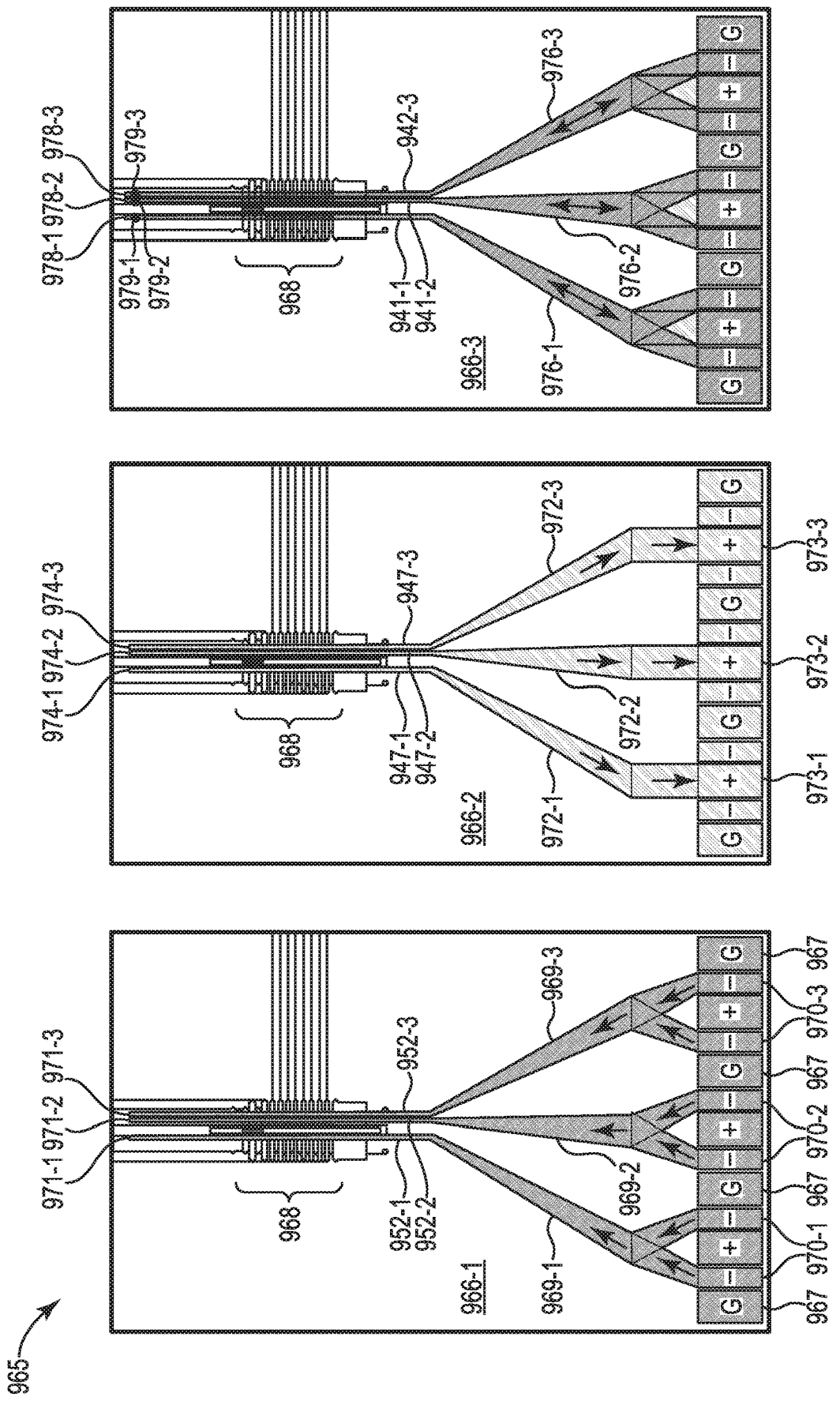
FIG. 9 illustrates another top view of a portion of an ion trap in accordance with one or more embodiments of the present disclosure.

As described further in connection with FIG. 9, a number of vias (e.g., as shown at 979-1, 979-2, 979-3, etc.) can be formed through a dielectric material (e.g., as shown at 849, etc.) that separates the input line and the output line. As such, the input line (e.g., 952-1) and the output line (e.g., 947-1), or extensions thereof, can be connected to one another by a via (e.g., 979-1) through the dielectric material to enable reversal in a direction (e.g., around a 180 degree turnaround) of the oscillating MW current.

FIG. 9 illustrates another top view of a portion of an ion trap in accordance with one or more embodiments of the present disclosure. The embodiment of the ion trap 965 illustrated in FIG. 9 can include components and positioning of components consistent with those illustrated in FIGS. 4-8 in an ion trap region 968, although embodiments are not so limited. The top views of the ion trap 965 shown in FIG. 9 are from a viewpoint that can illustrate more components of the ion trap system than illustrated in FIGS. 4-8. For example, more inclusive views are shown in FIG. 9 of portions of an ion trap die 966 that includes the ion trap region 968.

As further described in connection with FIG. 10, the view of ion trap die 966-1 schematically illustrates input connections 970-1, 970-2, 970-3 for input of oscillating MW current, for example, above an upper surface of the ion trap die 966-1 and at an edge of the ion trap die 966-1. In some embodiments, at least one of the input connections 970-1, 970-2, 970-3 can be split in two, for instance, to reduce far field magnetic effects. The oscillating MW current can be supplied directly or indirectly by, for example, a negative pole of a source (not shown). For example, the oscillating MW current can be supplied directly from a magnetron or the oscillating MW current can be supplied indirectly through an interposer (e.g., as shown at 332).

As further described in connection with FIG. 10, the oscillating MW current can, in various embodiments, be input by the three input connections 970-1, 970-2, 970-3 into three connected input conducting lines 969-1, 969-2, 969-3. In some embodiments, the three connected input conducting lines 969-1, 969-2, 969-3 can each be split near the edge of the ion trap die 966-1 to connect to each of the split input connections 970-1, 970-2, 970-3. The three connected input conducting lines 969-1, 969-2, 969-3 can be fabricated so as to narrow (e.g., in diameter, circumference, height, width, gauge, etc.) and/or become reduced in height relative to the surface of the ion trap die 966-1 so as to each fit within a trench in the ion trap region 968 (e.g., trenches shown at 1051-1, 1051-2, 1051-3 in FIG. 10), the trenches being fabricated (e.g., etched) in the ion trap die 966-1 (e.g., the substrate thereof).

As such, the input conducting lines 969-1, 969-2, 969-3 can be fabricated to become the input lines 952-1, 952-2, 952-3 that contribute to the MW rails that transit through the ion trap region 968 under the first planar conductive material (e.g., as shown at 1036, etc.). As shown at 971-1, 971-2, 971-3, the input lines 952-1, 952-2, 952-3 each can be fabricated to extend beyond the ion trap region 968 (e.g., in trenches under the first planar conductive material).

As further described in connection with FIG. 10, the view of ion trap die 966-2 schematically illustrates output connections 973-1, 973-2, 973-3 for output of previously input oscillating MW current. The output connections 973-1, 973-2, 973-3 can, for example, be positioned above the upper surface of the ion trap die 966-2 and at the edge of the ion trap die 966-2, similar to the input connections 970-1, 970-2, 970-3. In various embodiments, the oscillating MW current can be received directly or indirectly by a positive pole of the source (not shown). For example, the oscillating MW current can be received directly by the magnetron or the oscillating MW current can be received indirectly through the interposer (e.g., as shown at 332). In some embodiments, the previously input oscillating MW current can be output to a grounded line and/or receiver (not shown).

In various embodiments, the previously input oscillating MW current that has transited through the ion trap region 968 in the input lines 952-1, 952-2, 952-3 and subsequently in the extended input lines 971-1, 971-2, 971-3 that extend beyond the ion trap region 968 can be reversed in direction (e.g., around a 180 degree reversal in the direction of the oscillating MW current). As further described in connection with FIG. 10, the direction of the input oscillating MW current can be reversed into the extended output lines 974-1, 974-2, 974-3 that extend beyond the ion trap region 968. The extended output lines 974-1, 974-2, 974-3 can be fabricated to become the output lines 947-1, 947-2, 947-3 under the input lines 952-1, 952-2, 952-3 that contribute to the MW rails that transit through the ion trap region 968 (e.g., in trenches 1051-1, 1051-2, 1051-3) under the first planar conductive material (e.g., as shown at 1036, etc.).

The three output lines 947-1, 947-2, 947-3 can be connected to three output conducting lines 972-1, 972-2, 972-3. The output conducting lines 972-1, 972-2, 972-3 can be fabricated so as to broaden (e.g., in diameter, circumference, height, width, gauge, etc.) and/or be increased in height relative to the surface of the ion trap die 966-2 so as to each exit at least partially from its trench in the ion trap region 968 (e.g., trenches 1051-1, 1051-2, 1051-3). The three output lines 947-1, 947-2, 947-3 can be connected to the output connections 973-1, 973-2, 973-3 above the upper surface of the ion trap die 966-2 for output of previously input oscillating MW current.

The view of ion trap die 966-3 schematically illustrates an overlay of the view of ion trap die 966-1 onto the view of ion trap die 966-2. As shown in the view of ion trap die 966-3, the extended input lines 971-1, 971-2, 971-3 shown in 966-1 can be similar in size and/or position to the extended output lines 974-1, 974-2, 974-3 shown in 966-2 upon which the extended input lines 971-1, 971-2, 971-3 are vertically stacked. The extended input lines 971-1, 971-2, 971-3 vertically stacked upon (e.g., paired with) the extended output lines 974-1, 974-2, 974-3 are shown at 978-1, 978-2, 978-3, respectively, in ion trap die 966-3.

The extended input lines 971-1, 971-2, 971-3 and the extended output lines 974-1, 974-2, 974-3 can be separated (e.g., insulated) from each other. For example, the extended input lines 971-1, 971-2, 971-3 and the extended output lines 974-1, 974-2, 974-3 can be separated by a dielectric material (e.g., as shown at 849, 1049, etc.). In some embodiments, the dielectric material can be silicon dioxide (e.g., formed by thermal oxidation), for instance, although embodiments of the present disclosure are not so limited.

A number of vias 979-1, 979-2, 979-3 can be formed through the dielectric material that separates, for example, the extended input lines 971-1, 971-2, 971-3 from the extended output lines 974-1, 974-2, 974-3. As such, for example, the extended input line 971-1 paired with the extended output line 974-1 can be connected to one another by via 979-1 through the dielectric material to enable reversal in a direction (e.g., around a 180-degree turnaround) of the oscillating MW current. For clarity, the vias 979-1, 979-2, 979-3 are illustrated as being positioned slightly inward from ends of the paired extended input lines and extended output lines 978-1, 978-2, 978-3, although embodiments are not so limited.

As described herein, the input lines 952-1, 952-2, 952-3 shown in the view of ion trap die 966-1 and the output lines 947-1, 947-2, 947-3 shown in the view of ion trap die 966-2 can be similar in size and/or position so as to be vertically stacked (e.g., paired) to form MW rails 941-1, 941-2, 941-3 that extend through the ion trap region 968 in the view of ion trap die 966-3. In some embodiments, the input conducting lines 969-1, 969-2, 969-3 for the input lines 952-1, 952-2, 952-3 can be similar in size and/or position so as to be vertically stacked along at least part of a length of the output conducting lines 972-1, 972-2, 972-3 for the output lines 947-1, 947-2, 947-3, as shown at 976-1, 976-2, 976-3 in ion trap die 966-3. Similar to the MW rails 941-1, 941-2, 941-3, the input conducting lines 969-1, 969-2, 969-3 can be separated (e.g., insulated) from the output conducting lines 972-1, 972-2, 972-3 (e.g., by a dielectric material as described herein and as shown at 849, 1049, etc.) at least along the length that they are vertically stacked.

Figure 10:
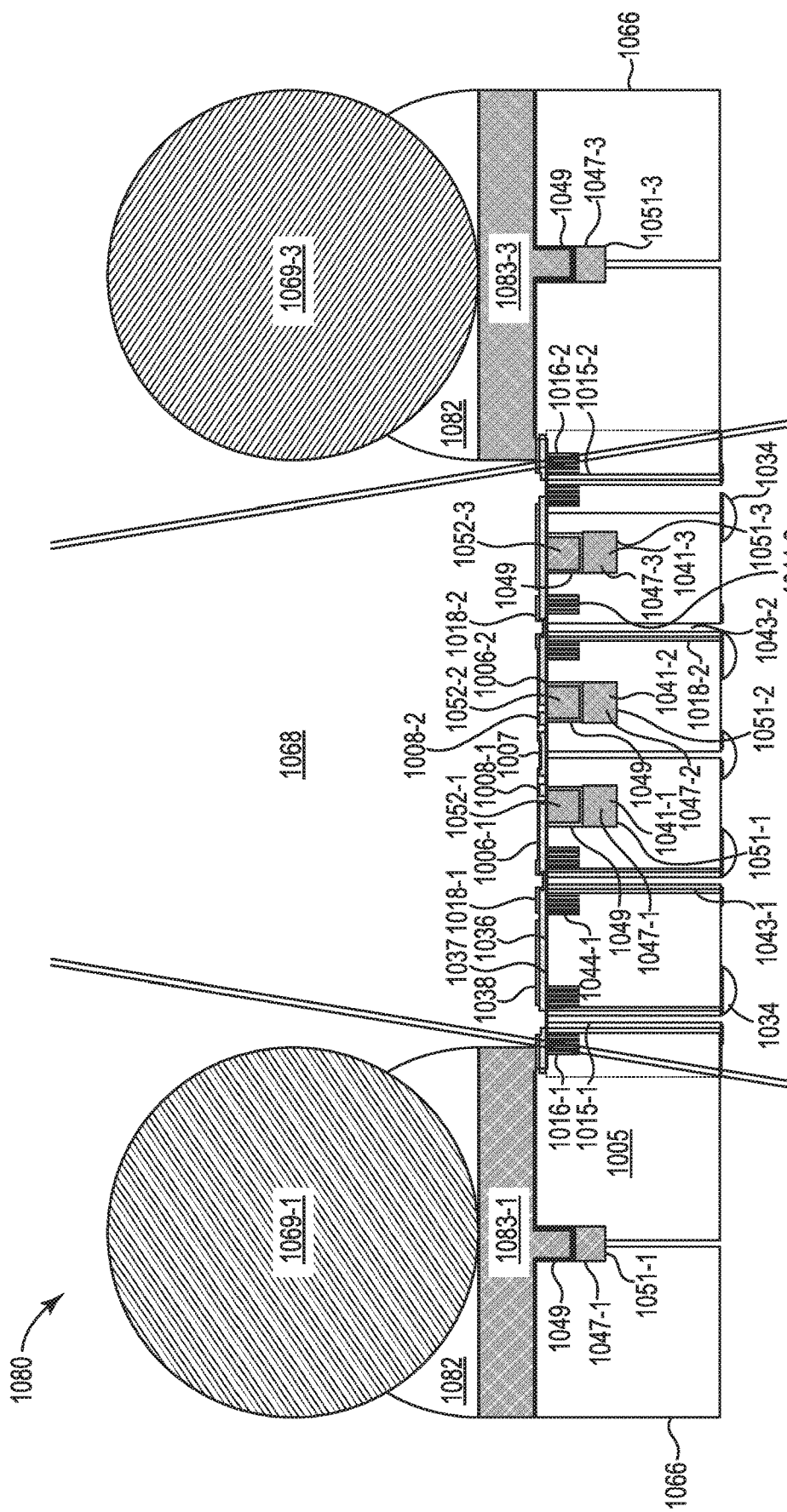
FIG. 10 illustrates another cross-sectional view of a portion of an ion trap in accordance with one or more embodiments of the present disclosure.

FIG. 10 illustrates another cross-sectional view of a portion of an ion trap in accordance with one or more embodiments of the present disclosure. The embodiment of the ion trap 1080 illustrated in FIG. 10 can include components and positioning of components consistent with those illustrated in FIGS. 4-9 in an ion trap region 1068 and in an ion trap die 1066, although embodiments are not so limited.

As such, the cross-sectional view of the ion trap 1080 shown in FIG. 10 illustrates a cross-sectional view of input conducting lines 1069-1, 1069-3 and associated components near the input connections (e.g., as shown at 970-1, 970-3 in FIG. 9) at the edge of the ion trap die 1066 outside the double lines. The ion trap region shown at 1068 between the double lines is consistent with the top views of the ion traps shown in FIGS. 4-7 and the cross-sectional view of the ion trap shown in FIG. 8. As described in connection with FIG. 8, the cross-sectional view of the ion trap region 1068 shown in FIG. 10 cuts through the positions of the second number of TSVs 1043-1, 1043-2 and the associated trench capacitors 1044-1, 1044-2, although, in some embodiments, DC electrodes may not be present past the longitudinal ends of the sequences of DC electrodes as shown at 750-1 and 750-2 in FIG. 7. The RF rails 1008-1, 1008-2, the MW rails 1041-1, 1041-2, 1041-3, and/or the GND rail 1007, however, can extend through the cut line, as shown in FIG. 7.

As described in connection with FIG. 3, the substrate 1005 shown in FIG. 10 in the ion trap region 1068, or elsewhere in the ion trap die 1066 (e.g., associated with the input connections 970 and/or output connections 973 shown in FIG. 9), can be bonded to an interposer (e.g., as shown at 332 in FIG. 3) with a plurality of bond pads 1034. The bond pads 1034 can be a conductive material (e.g., gold).

According to various embodiments of the present disclosure, an ion trap die 1066 can be formed by fabricating (e.g., etching) a plurality of (e.g., three) trenches 1051-1, 1051-2, 1051-3 below a surface of a substrate 1005 that each extends from an end of an ion trap die (e.g., the edge of the ion trap die 966 shown in FIG. 9) through an ion trap region 1068.

In various embodiments, the ion trap region 1068 can be configured to trap at least one ion (e.g., as shown at 804 in FIG. 8). The trenches each can, in various embodiments, be fabricated into the substrate 1005 with a width in a range of from around 10 microns to around 100 microns and a depth in a range of from around 20 microns to around 200 microns. In various embodiments, the trenches can be extended beyond the ion trap region 1068 for, for example, extended input lines and extended output lines (e.g., as shown at 971 and 974, respectively, in FIG. 9).

Embodiments of the ion trap die 1066 can be formed by partially filling a lower portion of the plurality of (e.g., each of three) trenches with a first conductive material (e.g., copper, among other conductive materials described herein) to operate as output lines 1047-1, 1047-2, 1047-3 and/or an output conducting line (e.g., as shown at 972 in FIG. 9) for MW current that has traveled beyond the ion trap region 1068. As described herein, a dielectric material 1049 can be formed above the first conductive material.

A plurality of (e.g., three) input conducting lines 1069-1, 1069-2, 1069-3 can be formed (e.g., fabricated from copper wire, among other conductive materials described herein, with a diameter in a range of from around 200 microns to around 800 microns) above the first conductive material (and the dielectric material) and starting above the substrate at the end of the ion trap die 1066. Input conducting line 1069-2 is not shown because it could be between the double lines in FIG. 10 where the ion trap region 1068 is shown. Each input conducting line can be configured to receive (e.g., from a pole of a source, such as a magnetron) a current (e.g., 0.1-1.0 amps) oscillating at a MW frequency (e.g., 0.1-100 gigahertz).

In various embodiments, a second conductive material 1083-1, 1083-2, 1083-3 (e.g., copper, among other conductive materials described herein) can be used for separately connecting the plurality of (e.g., each of three) input conducting lines to an upper surface of the substrate 1005 above the dielectric material 1049. Second conductive material 1083-2 is not shown because it could be between the double lines in FIG. 10 where the ion trap region 1068 is shown. The second conductive material can be used to fill a remaining upper portion of the plurality of (e.g., each of three) trenches 1051-1, 1051-2, 1051-3 to operate as input lines 1052-1, 1052-2, 1052-3 for the MW current to the ion trap region 1068. The input conducting lines 1069-1, 1069-2, 1069-3 can, in some embodiments, be connected to the second conductive material 1083-1, 1083-2, 1083-3 with a connecting material 1082 (e.g., solder, among other connecting materials).

As described in connection with FIG. 9, embodiments of the ion trap die 1066 can be formed by fabricating (e.g., etching) a via (e.g., as shown at 979 in FIG. 9) through the dielectric material 1049 proximate to a trench beyond the ion trap region 1068. For example, can at least partially intersect each extended trench for the paired extended input lines and extended output lines shown at 978 in FIG. 9. Accordingly, a paired input line and output line (e.g., each of the paired extended input lines and extended output lines) can be connected to the via to enable reversal (e.g., a 180-degree reversal) in a direction of the MW current. In various embodiments, reversal of the MW current can enable an output MW current to be connected to an opposite pole and/or a ground pole of the source.

In various embodiments, a third conductive material (e.g., copper, gold, and/or superconducting niobium, among other elements and/or alloys) can be formed as a MW shield (e.g., as shown at 848 in FIG. 8) above an upper surface and/or below a lower surface of the first conductive material 1036 at least in the ion trap region 1068. The MW shield can, in various embodiments, have separate portions individually positioned between the MW rails and overlying and/or nearby sequences of DC electrodes (e.g., as shown at 1006-1, 1006-2, etc.), RF rails (e.g., as shown at 1008-1, 1008-2, etc.), and/or GND rails (e.g., as shown at 1007, etc.).

Embodiments of the ion trap die 1066 can be formed by reducing a diameter and/or a height above the surface of the substrate 1005 of the plurality of (e.g., each of three) input conducting lines 1069-1, 1069-2, 1069-3 as the conducting lines transit from the end of the ion trap die 1066 to the ion trap region 1068 (e.g., as shown at 969 in FIG. 9). So reducing the diameter and/or the height above the surface of the substrate 1005 can enable forming (e.g., leaving) paired input lines 1052-1, 1052-2, 1052-3 and output lines 1047-1, 1047-2, 1047-2 in the trenches (e.g., each of the three trenches) 1051-1, 1051-2, 1051-3 that are below the planar first conductive material 1036 (and the surface of the substrate 1005) in the ion trap region 1068 to operate as a plurality of (e.g., three) MW rails 1041-1, 1041-2, 1041-3.

The embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure. It is also to be understood that the terminology used herein is for the purpose of describing particular embodiments only, and is not intended to be limiting.

As will be appreciated, elements shown in the various embodiments herein can be added, exchanged, combined, and/or eliminated so as to provide a number of additional embodiments of the present disclosure. The proportion and/or the relative scale of the elements provided in the figures are intended to illustrate the embodiments of the present disclosure, and should not be taken in a limiting sense.

As used herein, the singular forms "a", "an", and "the" include singular and plural referents, unless the context clearly dictates otherwise, as do "a number of", "at least one", and "one or more". For example, "a number of ion locations" can refer to one or more ion locations. Furthermore, the words "can" and "may" are used throughout this application in a permissive sense (i.e., having the potential to, being able to), not in a mandatory sense (i.e., must). The term "include", and derivations thereof, mean "including, but not limited to." The term "die" is used herein to mean a block of semiconducting material (e.g., electronic-grade silicon and/or another semiconductor) on which and/or in which a particular functionality (e.g., circuitry) can be fabricated.

Although specific embodiments have been illustrated and described herein, those of ordinary skill in the art will appreciate that an arrangement calculated to achieve the same techniques can be substituted for the specific embodiments shown. This disclosure is intended to cover any and all adaptations and/or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. In the foregoing Detailed Description, various features are grouped together in example embodiments illustrated in the figures for the purpose of streamlining the disclosure.

This method of disclosure is not to be interpreted as reflecting an intention that the embodiments of the disclosure require more features than are expressly recited in each claim. Rather, inventive subject matter lies in less than all features of a single disclosed embodiment. Therefore, the scope of various embodiments of the disclosure should be determined with reference to the appended claims, along with the full range of equivalents to which such claims are entitled.

What is claimed:

1. An ion trap apparatus, comprising:
   a number of microwave (MW) rails and a number of radio frequency (RF) rails formed with substantially parallel longitudinal axes and with substantially coplanar upper surfaces;
   a plurality of sequences of direct current (DC) electrodes with each sequence formed to extend substantially parallel to the substantially parallel longitudinal axes of the MW rails and the RF rails;
   a number of through-silicon vias (TSVs) formed through a substrate of the ion trap; and
   a trench capacitor associated with at least one TSV.

2. The apparatus of claim 1, wherein the plurality of sequences of DC electrodes are configured to be biased with DC voltages that contribute to a combined electrical field and magnetic field to trap at least one ion in a potential well above an upper surface of at least one of the DC electrodes, the MW rails, and the RF rails.

3. The apparatus of claim 1, wherein the number of RF rails are configured to conduct a current to contribute to a combined electrical field and magnetic field to trap at least one ion in a potential well above the DC electrodes, the MW rails, and the RF rails.

4. The apparatus of claim 1, wherein the number of MW rails are configured to conduct a current to contribute to a transition between quantum states of at least one ion in a potential well above the MW rails or the RF rails.

5. The apparatus of claim 1, wherein the number of TSVs formed through the substrate are configured to provide an electrical potential to DC electrodes in the plurality of sequences of DC electrodes.

6. The apparatus of claim 1, wherein the trench capacitor is configured with a capacitance to reduce unintended variation of an electrical field to which an associated DC electrode contributes.

7. The apparatus of claim 1, further comprising:
   a number of ground rails formed between the plurality of sequences of DC electrodes substantially parallel to the substantially parallel longitudinal axes of the plurality of sequences of DC electrodes, the MW rails, and the RF rails;
   wherein the number of ground rails are configured to stabilize a location in a potential well for at least one ion above an upper surface of the DC electrodes, the MW rails, the RF rails, and the ground rails.

8. An ion trap system, comprising:
   a substrate material;
   a plurality of sequential conductive materials formed above the substrate material, wherein:
      a first conductive material forms at least a portion of a ground plane;
      a second conductive material forms at least a portion of a signal routing plane; and
      a third conductive material forms at least a portion of a ground connection plane;
   a number of longitudinal gaps formed in the second conductive material, wherein the number of longitudinal gaps separate a plurality of longitudinal sequences of direct current (DC) electrodes from at a plurality of separate longitudinal radio frequency (RF) rails positioned between the plurality of sequences of DC electrodes;
   a first number of through-silicon vias (TSVs) formed through the substrate material; and
   a first number of trench capacitors associated with at least one of the first number of TSVs.

9. The system of claim 8, wherein an electrical potential is provided to a number of DC electrodes in the plurality of longitudinal sequences of DC electrodes via a connection, between the DC electrodes and the first number of TSVs, by the second conductive material.

10. The system of claim 8, wherein the plurality of longitudinal sequences of DC electrodes are connected to the first number of TSVs on an opposite side of the substrate from a source of an electrical potential connected to the first number of TSVs.

11. The system of claim 8, wherein a number of horizontal gaps are formed in the two longitudinal sequences of DC electrodes to form a plurality of longitudinal sequences of separate DC electrodes.

12. The system of claim 8, further comprising:
   a second number of TSVs formed through the substrate material and connected to the second conductive material; and
   a second number of trench capacitors associated with at least one of the second number of TSVs;
   wherein the second number of TSVs are formed longitudinally proximate to at least one DC electrode at longitudinal ends of the sequences of DC electrodes.

13. The system of claim 12, wherein the second conductive material connected to the second number of TSVs is connected by a number of vias to a longitudinal DC rotate rail formed from the third conductive material to reduce a variation of an electrical field to which the number of DC electrodes contributes.

14. The system of claim 8, wherein the number of longitudinal gaps are formed in the second conductive material to separate a plurality of longitudinal microwave (MW) rails positioned between the plurality of longitudinal sequences of DC electrodes from the plurality of longitudinal sequences of DC electrodes and the plurality of RF rails.

15. The system of claim 8, wherein the number of longitudinal gaps are formed in the second conductive material to separate a longitudinal ground rail positioned between two RF rails from the two longitudinal sequences of DC electrodes and the two RF rails.

16. The system of claim 8, further comprising at least two longitudinal microwave (MW) rails positioned in the substrate below the first conductive material.

17. The system of claim 8, wherein:
   at least one of the longitudinal MW rails is formed to include an input line for input of an oscillating MW current and an output line for output of the oscillating MW current; and
   the input line is positioned more proximate to the first conductive material than the output line.

18. The system of claim 17, further comprising:
   a number of vias formed through a dielectric material that separates the input line and the output line; and the input line and the output line connected to one another by a via through the dielectric material to enable reversal in a direction of the oscillating MW current.

19. A method of forming an ion trap system, comprising:
forming a plurality of sequential conductive materials above a substrate material, including:
a first conductive material forming at least a portion of a ground plane;
a second conductive material forming at least a portion of a signal routing plane; and
a third conductive material forming at least a portion of a ground connection plane;
forming a number of gaps in the second planar conductive material to separate longitudinal sequences of direct current (DC) electrodes from at least two separate longitudinal radio frequency (RF) rails positioned between the sequences of DC electrodes;
forming a first number of through-silicon vias (TSVs) through the substrate material; and
forming a first number of trench capacitors associated with at least one of the first number of TSVs to provide an electrical potential to each DC electrode of the longitudinal sequences of DC electrodes.

20. The method of claim 19, further comprising:
providing an electrical potential to a number of DC electrodes in the longitudinal sequences of DC electrodes by the DC electrodes being connected to the first number of TSVs by the second conductive material.

* * * * *